US007333731B2

(12) United States Patent
Taylor et al.

(10) Patent No.: US 7,333,731 B2
(45) Date of Patent: Feb. 19, 2008

(54) MULTIFUNCTIONAL OPTOELECTRONIC THYRISTOR AND INTEGRATED CIRCUIT AND OPTICAL TRANSCEIVER EMPLOYING SAME

(75) Inventors: Geoff W. Taylor, Mansfield, CT (US); Rohinton Dehmubed, Hamden, CT (US)

(73) Assignees: The University of Connecticut, Farmington, CT (US); Opel, Inc., Shelton, CT (US)

( * ) Notice: Subject to any disclaimer, the term of this patent is extended or adjusted under 35 U.S.C. 154(b) by 729 days.

(21) Appl. No.: 10/832,223

(22) Filed: Apr. 26, 2004

(65) Prior Publication Data

US 2005/0238360 A1 Oct. 27, 2005

(51) Int. Cl.
*H04B 10/00* (2006.01)
(52) U.S. Cl. ...................................... 398/138
(58) Field of Classification Search ................ 398/138, 398/135
See application file for complete search history.

(56) References Cited

U.S. PATENT DOCUMENTS

| 3,919,656 | A |   | 11/1975 | Sokal et al. |
|---|---|---|---|---|
| 4,317,232 | A | * | 2/1982 | Pickett et al. ............ 398/138 |
| 4,424,525 | A |   | 1/1984 | Mimura |
| 4,658,403 | A |   | 4/1987 | Takiguchi et al. |
| 4,683,484 | A |   | 7/1987 | Derkits, Jr. |
| 4,806,997 | A |   | 2/1989 | Simmons et al. |
| 4,814,774 | A |   | 3/1989 | Herczfeld |
| 4,827,320 | A |   | 5/1989 | Morkoc et al. |
| 4,829,272 | A |   | 5/1989 | Kameya |
| 4,899,200 | A |   | 2/1990 | Shur et al. |
| 4,949,350 | A |   | 8/1990 | Jewell et al. |
| 5,010,374 | A |   | 4/1991 | Cooke et al. |
| 5,105,248 | A |   | 4/1992 | Burke et al. |
| 5,202,896 | A |   | 4/1993 | Taylor |

(Continued)

FOREIGN PATENT DOCUMENTS

WO    WO-02/071490    9/2002

OTHER PUBLICATIONS

"10-Gb/s High-Speed Monolithically Integrated photoreceiver Using InGaAs p-i-n PD and Planar Doped InAlAs/InGaAs HEMT's" by Akahori et al. IEEE Photonics Technology Letters, vol. 4, No. 7, Jul. 1992.

(Continued)

*Primary Examiner*—Shi K. Li
*Assistant Examiner*—Quan-Zhen Wang
(74) *Attorney, Agent, or Firm*—Gordon & Jacobson, PC

(57) ABSTRACT

An integrated circuit (and optical transceiver module) includes an optoelectronic thyristor device formed within a resonant cavity on a substrate, and circuitry integrally formed on the substrate that dynamically switches the thyristor between a transmit mode configuration and a receive mode configuration. In the transmit mode configuration, the thyristor is modulated between a non-lasing state and a lasing state in accordance with an input digital electrical signal. In the receive mode configuration, the thyristor device is modulated between a non-lasing OFF state and a non-lasing ON state in accordance with an input digital optical signal that is injected into the resonant cavity to thereby produce an output digital electrical data signal that corresponds to the input digital optical signal. The integrated circuit (and optical transceiver module) can be used in optical fiber applications as well as free-space applications.

38 Claims, 16 Drawing Sheets

U.S. PATENT DOCUMENTS

| | | | |
|---|---|---|---|
| 5,204,871 | A | 4/1993 | Larkins |
| 5,288,659 | A | 2/1994 | Koch et al. |
| 5,337,328 | A | 8/1994 | Lang et al. |
| 5,349,599 | A | 9/1994 | Larkins |
| 5,386,128 | A | 1/1995 | Fossum et al. |
| 5,422,501 | A | 6/1995 | Bayraktaroglu |
| 5,436,759 | A | 7/1995 | Dijaili et al. |
| 5,452,118 | A | 9/1995 | Maruska |
| 5,698,900 | A | 12/1997 | Bozada et al. |
| 5,909,294 | A * | 6/1999 | Doerr et al. ............... 398/138 |
| 5,999,553 | A | 12/1999 | Sun |
| 6,031,243 | A | 2/2000 | Taylor |
| 6,043,519 | A | 3/2000 | Shealy et al. |
| 6,479,844 | B2 | 11/2002 | Taylor |
| 6,628,854 | B1 | 9/2003 | Koh et al. |
| 6,720,584 | B2 | 4/2004 | Hata et al. |
| 2002/0054409 | A1 | 5/2002 | Bartur et al. |
| 2002/0067877 | A1 | 6/2002 | Braun et al. |
| 2002/0121647 | A1* | 9/2002 | Taylor ...................... 257/192 |
| 2003/0007754 | A1 | 1/2003 | Terashima |

OTHER PUBLICATIONS

"10-Gbit/s InP-Based High-Performance Monolithic Photoreceivers Consisting of p-i-n Photodiodes and HEMT's" by Takahata et al., IEICE Trans. Electron., vol. E83-C, No. 6 Jun. 2000.

"10 Ghz Bandwidth Monolithic p-i-n Modulation-doped Field Effect Transistor Photoreceiver" by Dutta et al., Appl. Phys. Lett., vol. 63, No. 15, Oct. 11, 1993.

"20 Gbit/s Long Wavelength Monolithic Integrated Photoreceiver Grown on GaAs" by Hurm, et al., Electronics Letters, vol. 33, No. 7, Mar. 27, 1997.

"Monolithic Integrated Optoelectronic Circuits" by Berroth et al., Fraunhofer Institute for Applied Solid State Physics(IAF), Germany, IEEE 1995.

"Heterojunction Field-Effect Transistor (HFET)", Reprinted from Electronics Letters, vol. 22, No. 15, pp. 784-786, Jul. 17, 1986.

"High Temperature Annealing of Modulation Doped GaAs/AlGaAs Heterostructures for FET Applications" by Lee et al., 1983 IEEE/Cornell Conf. On High-Speed Semiconductor Devices & Ckts, Aug. 1983.

"Submicrometre Gate Length Scaling of Inversion Channel Heterojunction Field Effect Transistor" by Kiely et al., Electronics Letters, vol. 30, No. 6 Mar. 17, 1994.

"Theoretical and Experimental Results for the Inversion Channel Heterostructure Field Effect Transistor" by Taylor et al., IEE Proceedings-G, vol. 140, No. 6, Dec. 1993.

"Zonu Debuts Industry's First Single Fiber, Single Mode Gigabit Small Form Plugable Transceiver", by Alon and Mayer, http://www.expresspress.com/news/zonu_022502.html.

"622Mbps Single Fiber Bi-Directional Optical Transceiver (SFF)", Appointech, Inc. 2003.

"Infineon Introduces Small-Form-Factor Single-Fiber Bi-Directional Optical Transceiver at OFC Conference—Compact New Device Reduces Fiber Cost, Doubles Capacity of Optical Networks With No New Fibers", Infineon Technologies AG, Mar. 19, 2002. http://www.infineon.com/news/press/203_062e.htm.

* cited by examiner

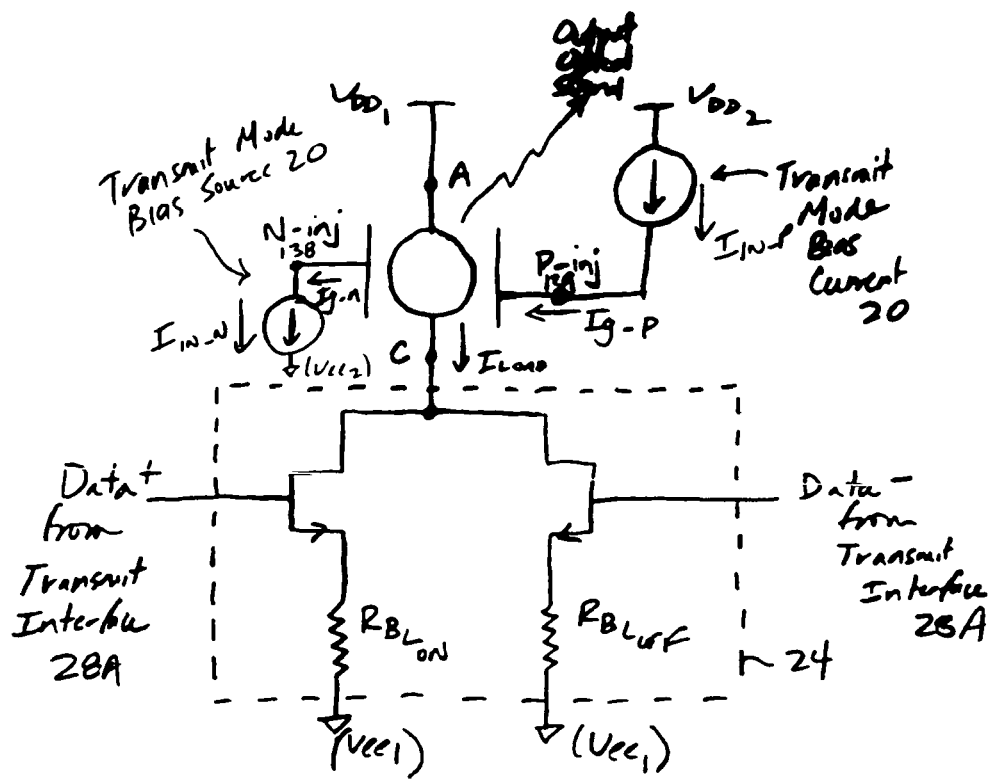
FIG. 3A1
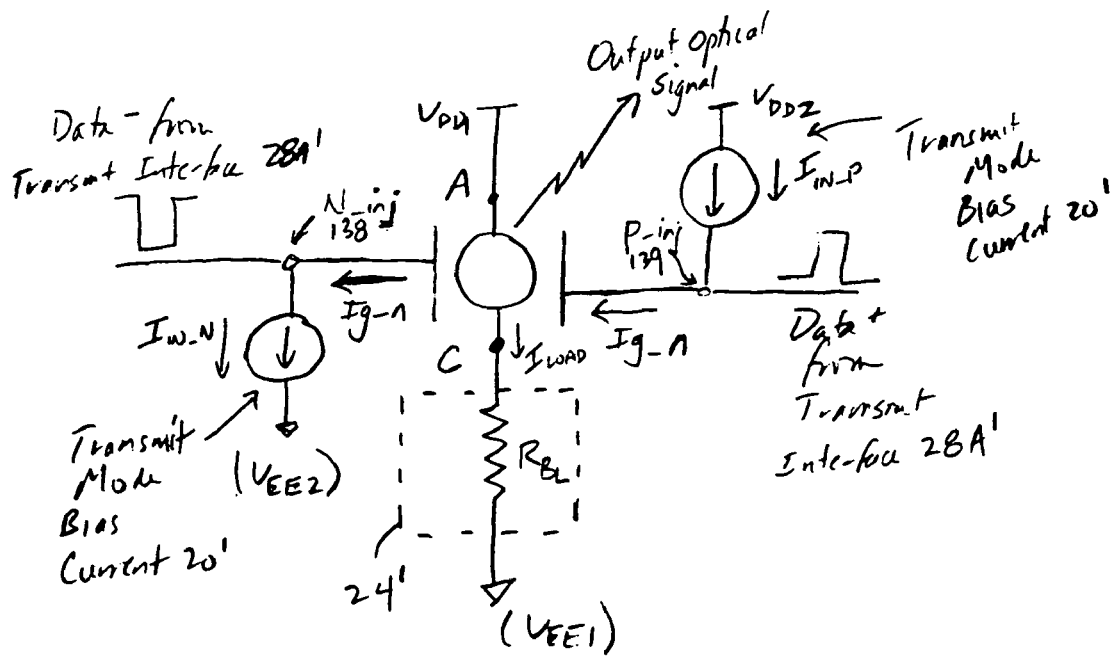
FIG. 3A2

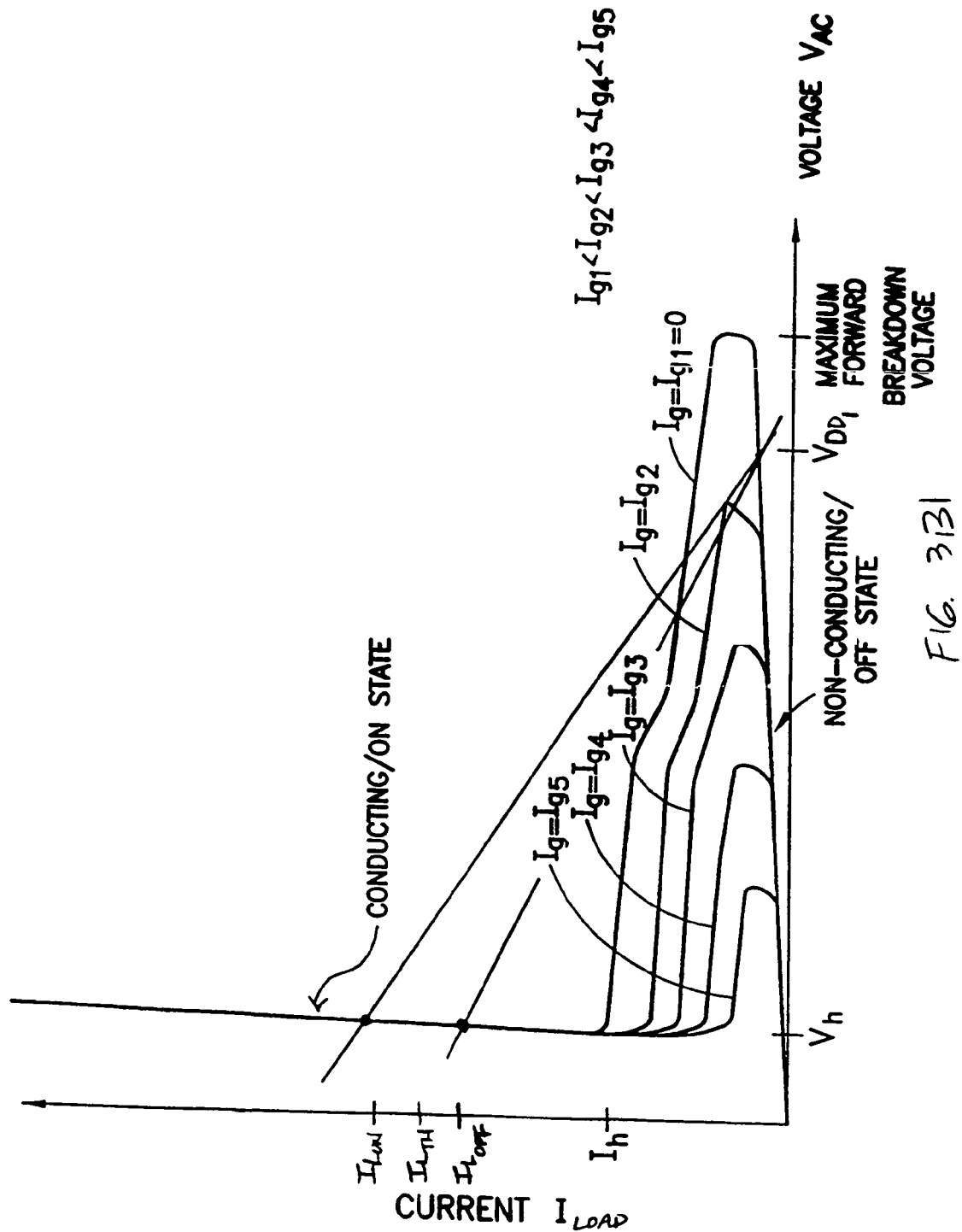
FIG. 3131

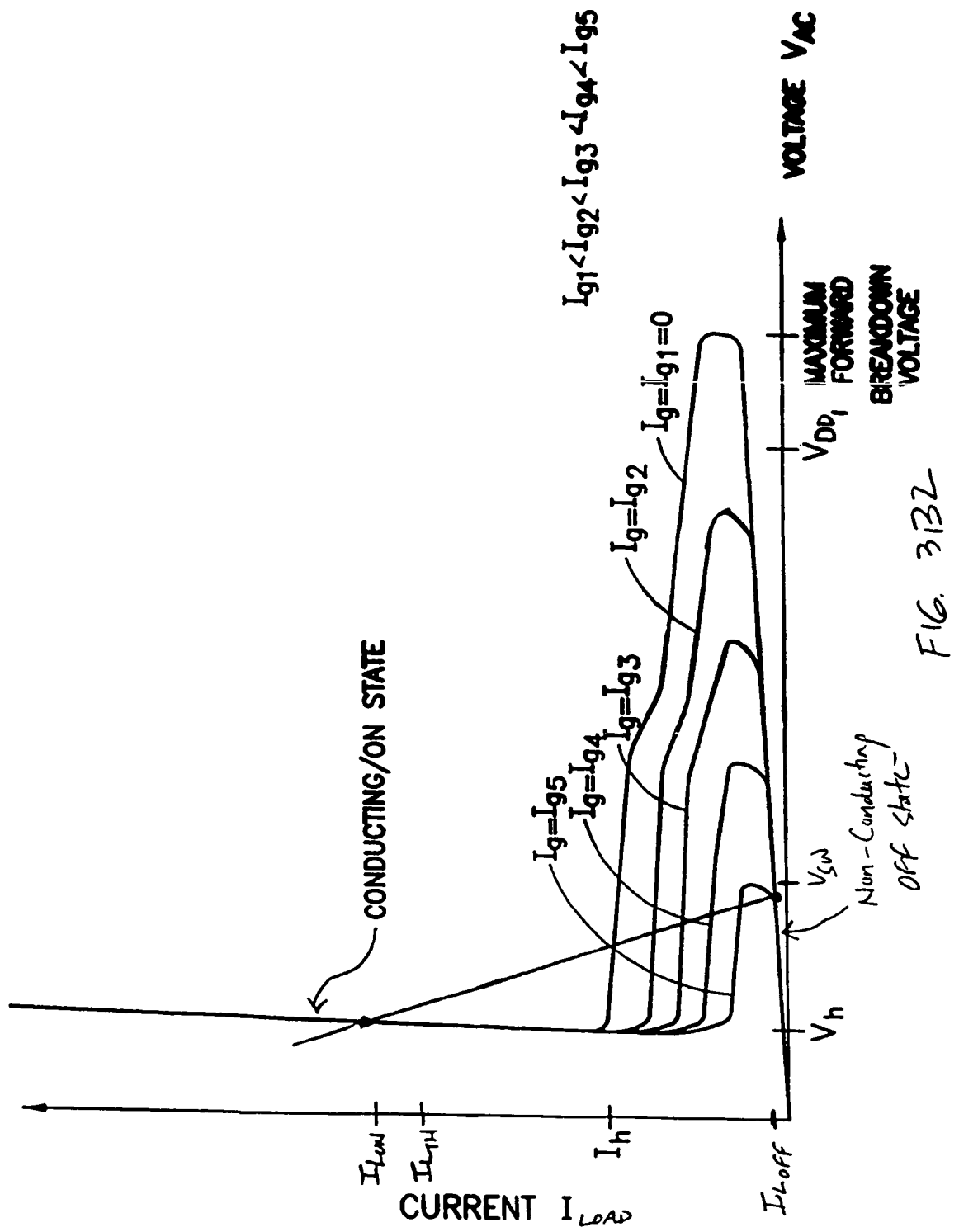
FIG. 3I32

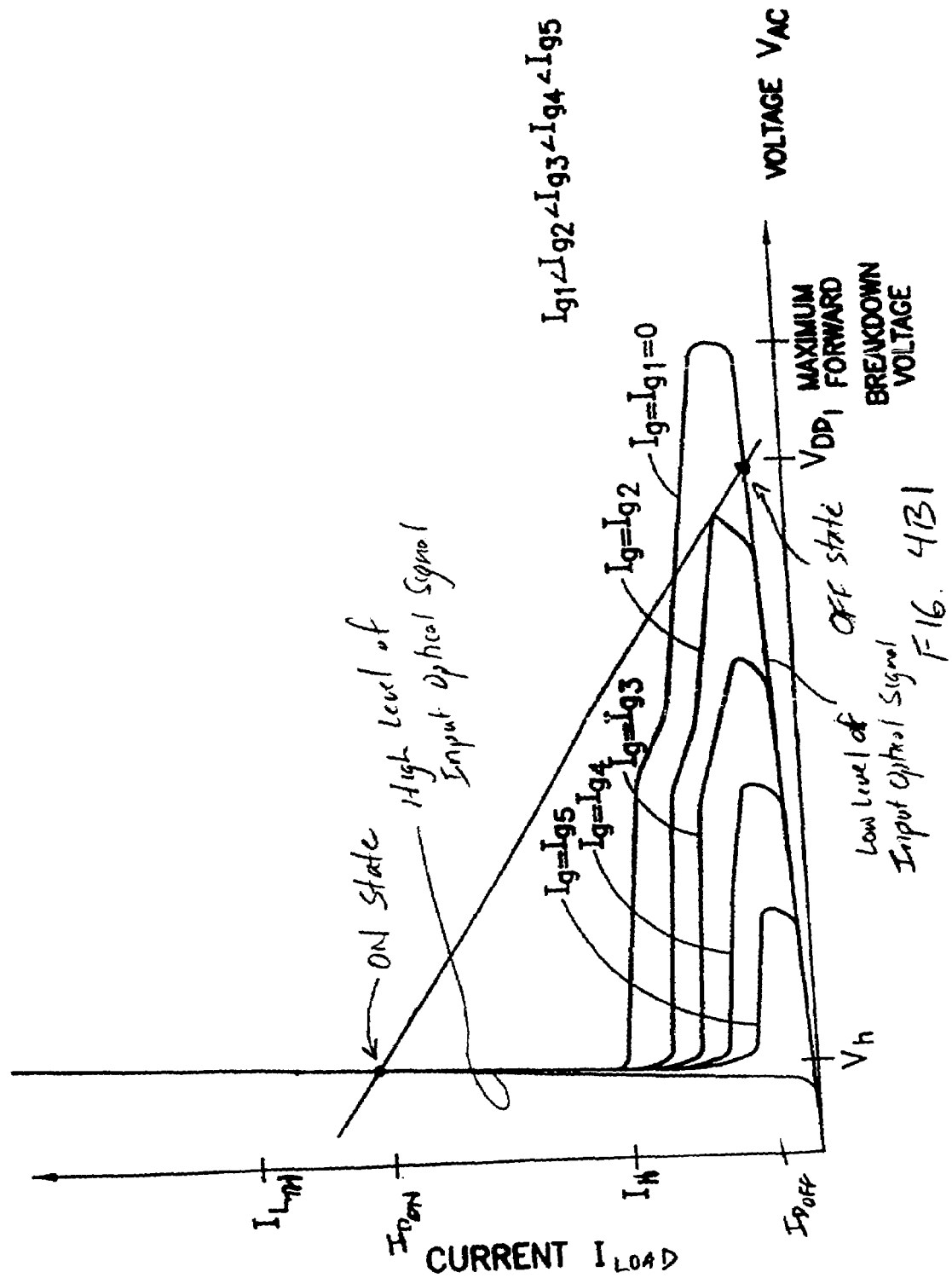
FIG. 4B1

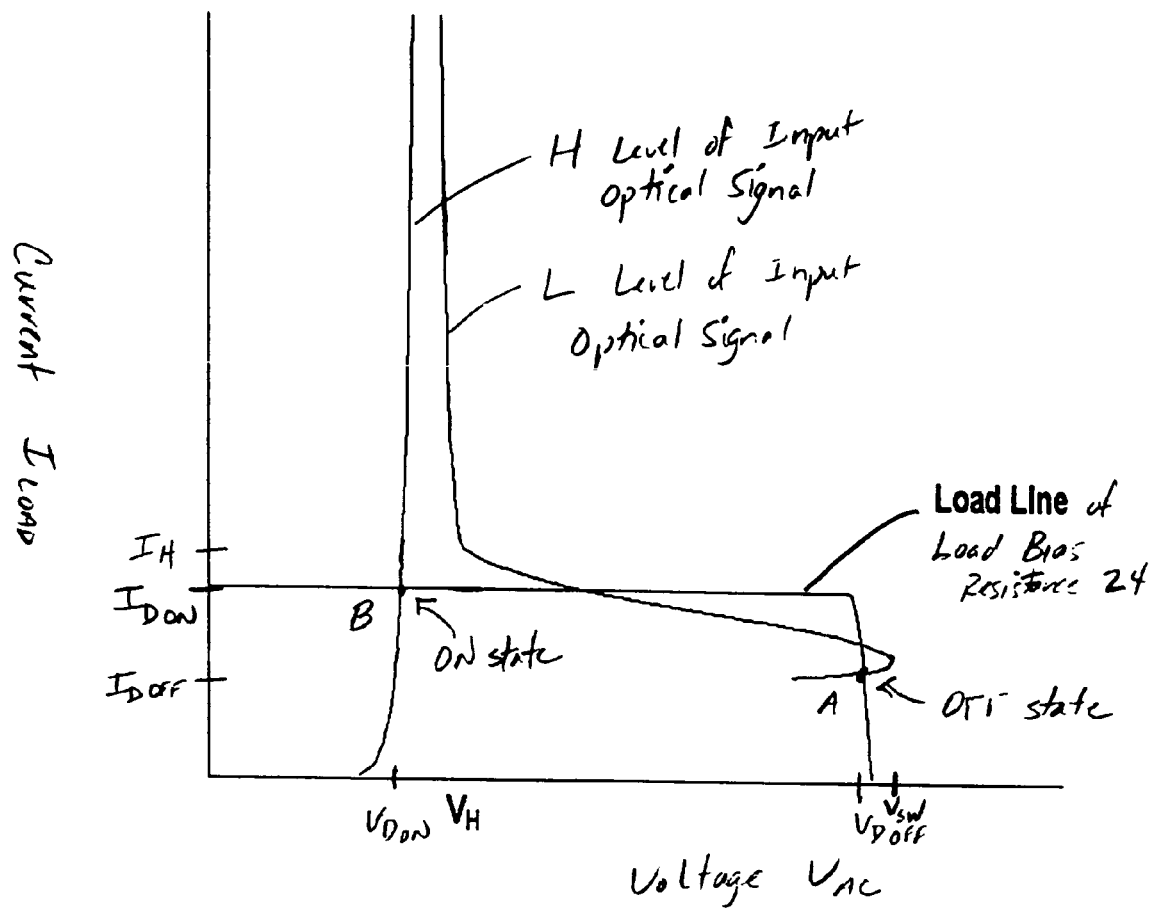
FIG. 4B2

| | J1 | J2 | J3 | J4 | J5 | J6 | Data_In | OutO | InO | Data_Out |
|---|---|---|---|---|---|---|---|---|---|---|
| Transmit Mode: | OFF | OFF | ON | ON | OFF | ON | L | L | N/A | N/A |
| | OFF | OFF | ON | ON | ON | OFF | H | H | N/A | N/A |
| Receive Mode: | ON | ON | ON | ON | OFF | ON | N/A | N/A | L | L |
| | ON | ON | ON | ON | OFF | ON | N/A | N/A | H | H |

FIG. 5B

| | J11 | J12 | J13 | J14 | J15 | J16 | Data_In | OutO | Data_In | InO | Data_Out |
|---|---|---|---|---|---|---|---|---|---|---|---|
| Transmit Mode: | OFF | OFF | ON | ON | ON | OFF | L | L | N/A | N/A | N/A |
| | OFF | OFF | ON | ON | ON | OFF | H | H | N/A | N/A | N/A |
| Receive Mode: | ON | ON | ON | ON | OFF | ON | N/A | N/A | L | L | L |
| | ON | ON | ON | ON | OFF | ON | N/A | N/A | H | H | H |

FIG 5D

MULTIFUNCTIONAL OPTOELECTRONIC THYRISTOR AND INTEGRATED CIRCUIT AND OPTICAL TRANSCEIVER EMPLOYING SAME

BACKGROUND OF THE INVENTION

1. Field of the Invention

This invention relates broadly to telecommunications. More particularly, this invention relates to optical transceiver modules capable of transmitting and receiving optical signals.

2. State of the Art

Optical communication networks provide the advantages of increased speed and transmission capacity for carrying voice and data. In optical communication networks, optical signals (e.g., light waves) are used to carry the information over the network. Such systems employ optical transmitters and optical receivers throughout the network. There are three different types of optical links typically employed in optical communication networks. The first type is a point-to-point optical link wherein an optical transmitter communicates with one optical receiver. The second type is a point-to-multipoint optical link (or broadcast optical link) wherein an optical transmitter communicates with many optical receivers. The third type is a multipoint-to-point optical link (network optical link) wherein many optical transmitters communicate with an optical receiver.

These various types of optical links are typically realized by optical transceiver modules that employ a first set of opto-electrical components for transmitting optical signals at a particular wavelength (e.g., laser diode and accompanying driver circuitry) as well as a second set of opto-electrical components (e.g., photodetector, transimpedance amplifier, etc.) for receiving optical signals at a particular wavelength. An example of such optical transceiver modules is shown in U.S. Patent Application No. US 2002/0054409 A1 to Barter et al. However, such prior art optical transceiver modules are expensive to design and manufacture, typically requiring complex packaging solutions to integrate the transmitting and receiving components of the module as illustrated in U.S. Patent Application No. US 2003/0007754 A1 to Terashima and U.S. Pat. No. 6,628,854 B1 to Koh et al.

Importantly, the design costs and manufacturing costs associated with such prior art optical transceiver modules have provided a barrier to the widespread adoption of such modules in many applications, such as fiber-to-the-home and other passive optical network systems, and point-to-point interconnects (for example, between routers or between a server and one or more storage units).

Thus, there remains a need in the art to provide an improved optical transceiver module that efficiently and effectively integrates the transmitting and receiving components of the module in a cost effective manner.

SUMMARY OF THE INVENTION

It is therefore an object of the invention to provide optoelectronic circuitry that efficiently and effectively integrates both optical transmitting functionality and optical receiving functionality.

It is a further object of the invention to provide optoelectronic circuitry that can efficiently and effectively provides dynamic bandwidth adjustment over a half-duplex optical communication channel.

It is another object of the invention to provide such optoelectronic circuitry as part of a low-cost optical transceiver module.

In accord with these objects, which will be discussed in detail below, an integrated circuit (and optical transceiver module based thereon) employs an optoelectronic thyristor device formed within a resonant cavity on a substrate. A circuit is provided that dynamically switches the thyristor between a transmit mode configuration and a receive mode configuration. In the transmit mode configuration, the thyristor is modulated between a lasing state and a non-lasing state in accordance with an input digital electrical signal, to thereby produce an output digital optical data signal that corresponds to the input digital electrical signal. In the receive mode configuration, the thyristor device is modulated between a non-lasing ON state and a non-lasing OFF state in accordance with an input digital optical signal that is injected into the resonant cavity, to thereby produce an output digital electrical data signal that corresponds to the input digital optical signal. The resonant cavity may be adapted for vertical emission and injection of light, or for in-plane emission and injection of light. For in-plane configurations, a passive waveguide device guides light to and from the resonant cavity. The integrated circuit (and optical transceiver module) can be used in optical fiber applications as well as free-space applications.

In one embodiment, the optoelectronic thyristor device is modulated between the lasing state and non-lasing state in the transmit mode configuration by current sources that are operably coupled to the injector control terminals of the optoelectronic thyristor device to inject into and draw charge from the quantum well interfaces of the optoelectronic thyristor device.

In another embodiment, the optoelectronic thyristor device is modulated between the lasing state and non-lasing state in the transmit mode configuration by varying the bias current applied to the cathode terminal and/or anode terminal of the optoelectronic thyristor device.

Preferably, the optoelectronic thyristor device and the circuit are integrally formed on a common substrate. Such monolithic integration combines optical-to-electrical conversion functionality, electrical-to-optical conversion functionality as well as the control circuitry associated therewith, which significantly reduces the costs of the integrated circuit (and an optical transceiver module based thereon).

Additional objects and advantages of the invention will become apparent to those skilled in the art upon reference to the detailed description taken in conjunction with the provided figures.

BRIEF DESCRIPTION OF THE DRAWINGS

FIGS. 3A1, 3A2, 3B1, 3B2, and 3C illustrate the Transmit Mode operational characteristics of the thyristor device of FIGS. 2A and 2B.

FIGS. 4A, 4B1, 4B2 and 4C illustrate the Receive Mode operational characteristics of the thyristor device of FIGS. 2A and 2B;

FIGS. 5A and 5B illustrate an exemplary realization of an optoelectronic thyristor-based integrated circuit for use in the optical transceiver module of FIG. 2A;

FIGS. 5C and 5D illustrate an exemplary realization of an optoelectronic thyristor-based integrated circuit for use in the optical transceiver module of FIG. 2B.

DETAILED DESCRIPTION OF THE PREFERRED EMBODIMENTS

Figure 1:
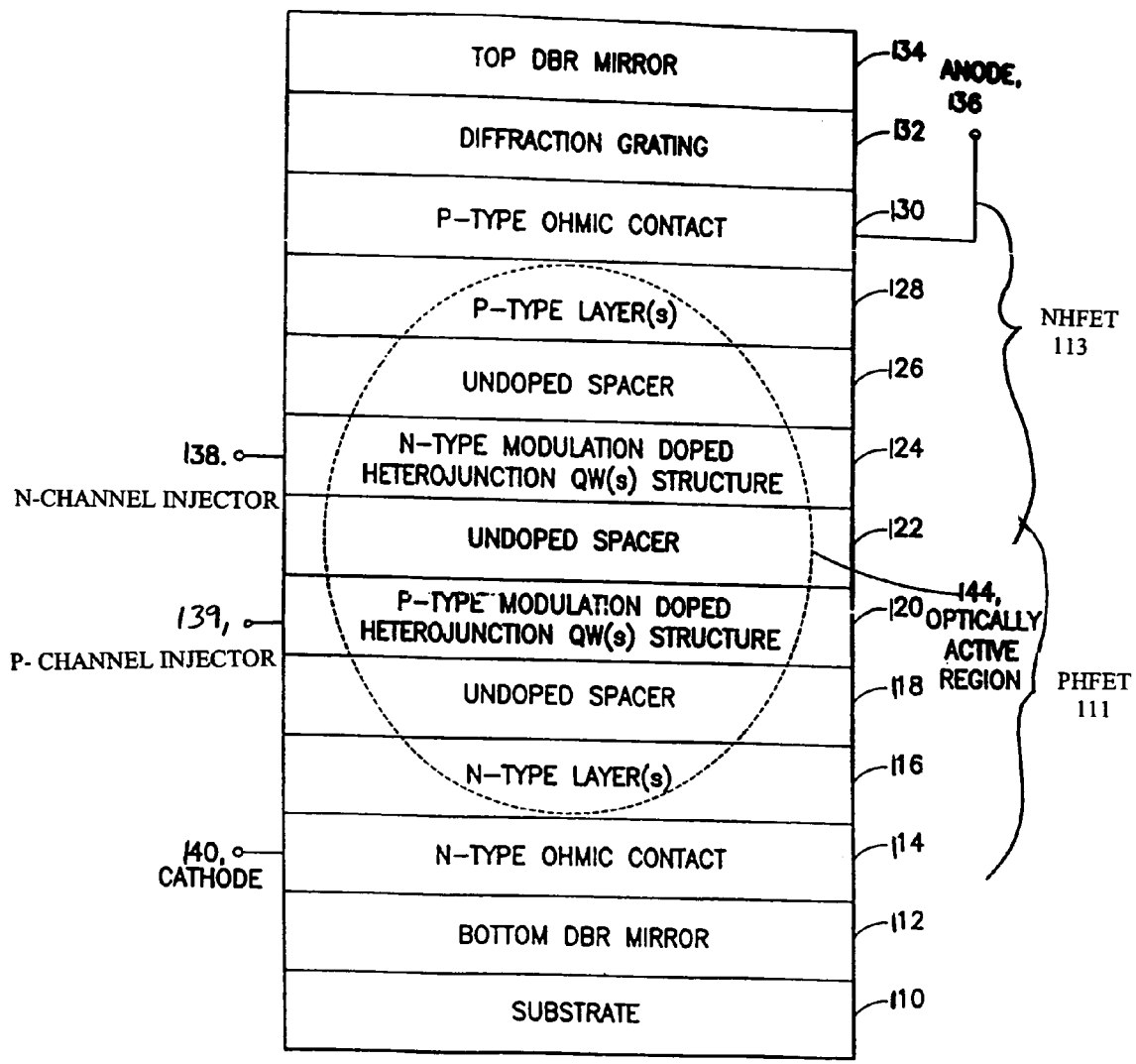
FIG. 1 illustrates an exemplary layer structure for realizing an optoelectronic thyristor device in addition to an optoelectronic thyristor-based integrated circuit and optical transceiver module in accordance with the present invention.

Turning now to FIG. 1, there is shown an exemplary layer structure for realizing an optoelectronic thyristor device, including a bottom dielectric distributed Bragg reflector (DBR) mirror 112 formed on a substrate 110. The bottom DBR mirror 112 typically is formed by depositing pairs of semiconductor or dielectric materials with different refractive indices. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4n$) optical thickness, the reflections from each of the boundaries will be added in phase to produce a large amount of reflected light (e.g., a large reflection coefficient) at the particular center wavelength $\lambda_D$. Deposited upon the bottom DBR mirror 112 is the active device structure that consists of two HFET devices. The first of these is a p-channel HFET 111 (comprising layers 114,116, 118,120 and 122) which has one or more p-type modulation doped quantum wells and is positioned with the gate terminal on the lower side (i.e. on the mirror as just described) and the collector terminal on the upper side. The second of these is an n-channel HFET 113 (comprising layers 122,124,126, 128,130) which has one or more n-type modulation doped quantum wells and is positioned with the gate terminal on the top side and the collector terminal on the lower side which is the collector of the p-channel device. Therefore a non-inverted N-channel device is stacked upon an inverted p-channel device to form the active device structure.

The active device layer structure begins with an n-type ohmic contact layer(s) 114 which enables the formation of ohmic contacts thereto. As shown, ohmic contact layer 114 is operably coupled to cathode terminal 140 of the thyristor device (which corresponds to the gate electrode of the p-channel HFET device 111). Deposited on layer 114 are one or more n-type layers 116 and an undoped spacer layer 118 which serve electrically as part of the P-channel HFET gate and optically as a part of the lower waveguide cladding of the device. Deposited on layer 118 is a p-type modulation doped heterojunction structure 120 that defines one or more quantum wells (which may be formed from strained or unstrained heterojunction materials). Deposited on p-type modulation doped heterojunction structure 120 is an undoped spacer layer 122, which forms the collector of the P-channel HFET device. All of the layers grown thus far form the P-channel HFET device 111 with the gate ohmic contact on the bottom.

Undoped spacer layer 122 also forms the collector region of the N-channel HFET device 113. Deposited on layer 122 is an n-type modulation doped heterojunction structure 124 that defines one or more quantum wells (which may be formed from strained or unstrained heterojunction materials). Deposited on the n-type modulation doped heterojunction structure 124 is an undoped spacer layer 126 and one or more p-type layers 128 which serve electrically as part of the n-channel HFET gate 113 and optically as part of the upper waveguide cladding of the device. Preferably, the p-type layers 128 include two sheets of planar doping of highly doped p-material separated by a lightly doped layer of p-material. These p-type layers are separated from the n-type modulation doped heterojunction structure 124 by undoped spacer material 126. In this configuration, the top charge sheet achieves low gate contact resistance and the bottom charge sheet defines the capacitance of the n-channel HFET 113 with respect to the N-type modulation doped QW heterojunction structure 124. Deposited on the p-type layer(s) 128 is a p-type ohmic contact layer(s) 130 which enables the formation of ohmic contacts thereto. As shown, ohmic contact layer(s) 130 is operably coupled to the anode terminal 136 of the thyristor device (which corresponds to the gate electrode of the n-channel HFET device 113).

Alternatively, the active device structure may be described as a pair of stacked quantum-well-base bipolar transistors formed on the bottom DBR mirror 112. The first of these is a p-type quantum-well-base bipolar transistor (comprising layers 114,116,118,120 and 122) that has one or more p-type modulation doped quantum wells and is positioned with the emitter terminal on the lower side (i.e. on the mirror as just described) and the collector terminal on the upper side. The second of these is an n-type quantum-well-base bipolar transistor (comprising layers 122,124,126,128, 130) that has one or more n-type modulation doped quantum wells and is positioned with the emitter terminal on the top side and the collector terminal on the lower side which is the collector of the p-type quantum-well-base bipolar transistor. In this configuration, the cathode terminal 140 of the thyristor device corresponds to the emitter electrode of the p-type quantum-well-base bipolar transistor, the p-type QW structure 120 corresponds to the base region of the p-type quantum-well-base bipolar transistor, spacer layer 122 corresponds to the collector region of both the p-type quantum-well-base bipolar transistor and the n-type quantum-well-base bipolar transistor, the n-type QW structure 124 corresponds to the base region of the n-type quantum-well-base bipolar transistor, and the anode terminal 136 of the thyristor device corresponds to the emitter electrode of the n-type quantum-well-base bipolar transistor.

An n-channel injector terminal 138 (which is analogous to the gate terminal of conventional thyristor devices) is operably coupled to the QW channel(s) realized in the n-type modulation doped heterojunction structure 124 as shown. A p-channel injector terminal 139 is operably coupled to the QW channel(s) realized in the p-type modulation doped heterojunction structure 120.

To form a resonant cavity device where light is input into and emitted from the device laterally (i.e., from a direction normal to the cross section of FIG. 1), a diffraction grating 132 and a top dielectric mirror 134 are formed over the active device structure described above. When the thyristor device is operating in the lasing mode, the diffraction grating 132 performs the function of diffracting light produced by the vertical cavity into light propagating laterally in a waveguide which has the top dielectric mirror 134 and bottom DBR mirror 112 as waveguide cladding layers and which has lateral confinement regions (typically formed by implants as described herein in more detail). When the thyristor device is operating in the optical detection mode, the diffraction grating 132 performs the function of diffracting incident light that is propagating in the lateral direction into the vertical cavity mode, where it is absorbed resonantly in the vertical cavity.

Alternatively, light may enter and exit the resonant vertical cavity through an optical aperture (not shown) in the top surface of the device. In this case, the diffraction grating 132 is omitted, the top dielectric mirror 134 defines a cavity for the vertical emission and absorption of light, and the device operates as a vertical cavity surface emitting laser/detector.

In either configuration, an optically active region 144 that encompasses the QW channel(s) of structures 124 and 120 is defined. When the thyristor device is operating in the lasing mode, light is generated in the optically active region 144 of the vertical cavity where it resonates for output therefrom to produce an optical signal (which propagates in the vertical dimension or in the lateral dimension with the use of diffraction grating 132 as described above).

When the thyristor device is operating in the optical detection mode, an optical signal (which propagates in the vertical direction, or which propagates in the lateral direction and is diffracted from the lateral direction into a vertical propagation direction by diffraction grating 132) is resonantly absorbed in region 144, which induces a change in the current flowing through the device.

The distance between the top dielectric mirror 134 and the bottom DBR mirror 112 preferably represents an integral number of ½ wavelengths at the designated wavelength. This distance is controlled by adjusting the thickness of one or more of the layers therebetween to enable this condition. In addition, the material system of the active device structure (including the bandgap energy and thickness of the p-type modulation doped heterojunction structure 120 and the n-type modulation doped heterojunction structure 124) are adapted to emit and/or absorb light at the designated wavelength.

The layer structure of FIG. 1 may also be used to produce various transistor devices (including n-channel HFET devices, p-channel HFET devices, n-type quantum-well-base bipolar transistors and p-type quantum-well-base bipolar transistors) as well as various optical devices (including passive waveguides, optical modulators, optical amplifiers, etc.) as described in detail in U.S. Pat. No. 6,031,243; U.S. patent application Ser. No. 09/556,285, filed on Apr. 24, 2000; U.S. patent application Ser. No. 09/798,316, filed on Mar. 2, 2001; International Application No. PCT/US02/06802 filed on Mar. 4, 2002; U.S. patent application Ser. No. 08/949,504, filed on Oct. 14, 1997, U.S. patent application Ser. No. 10/200,967, filed on Jul. 23, 2002; U.S. application Ser. No. 09/710,217, filed on Nov. 10, 2000; U.S. Patent Application No. 60/376,238, filed on Apr. 26, 2002; U.S. patent application Ser. No. 10/323,390, filed on Dec. 19, 2002; U.S. patent application Ser. No. 10/280,892, filed on Oct. 25, 2002; U.S. patent application Ser. No. 10/323,390, filed on Dec. 19, 2002; U.S. patent application Ser. No. 10/323,513, filed on Dec. 19, 2002; U.S. patent application Ser. No. 10/323,389, filed on Dec. 19, 2002: U.S. patent application Ser. No. 10/323,388, filed on Dec. 19, 2002; U.S. patent application Ser. No. 10/340,942, filed on Jan. 13, 2003; and U.S. patent application Ser. No. 10/602,217 filed on Jun. 24, 2003; all of which are hereby incorporated by reference herein in their entireties. With these structures, a single fabrication sequence is used to make all the devices, including the electrical devices (e.g., transistors) and the optoelectronic devices (e.g., laser/detector/modulator). In other words, a single set of n type and p type contacts, critical etches, dielectric depositions etc. are used to realize all of these devices simultaneously. The essential features of this device structure include 1) complementary n-type and p-type modulation doped quantum well interfaces, 2) a refractory metal gate/emitter contact, 3) self-aligned channel contacts formed by ion implantation, 4) n-type metal contacts to the n-type ion implants and the bottom n-type layer, and 5) p-type metal contacts to the p-type layers. Optical devices are created by separating the metal gate into two sections that are connected electrically by the P+ layer along the top surface. By depositing a top dielectric mirror over the device structure, a waveguide is formed with an optical mode centered near the modulation doped quantum well interfaces.

Figure 2A:
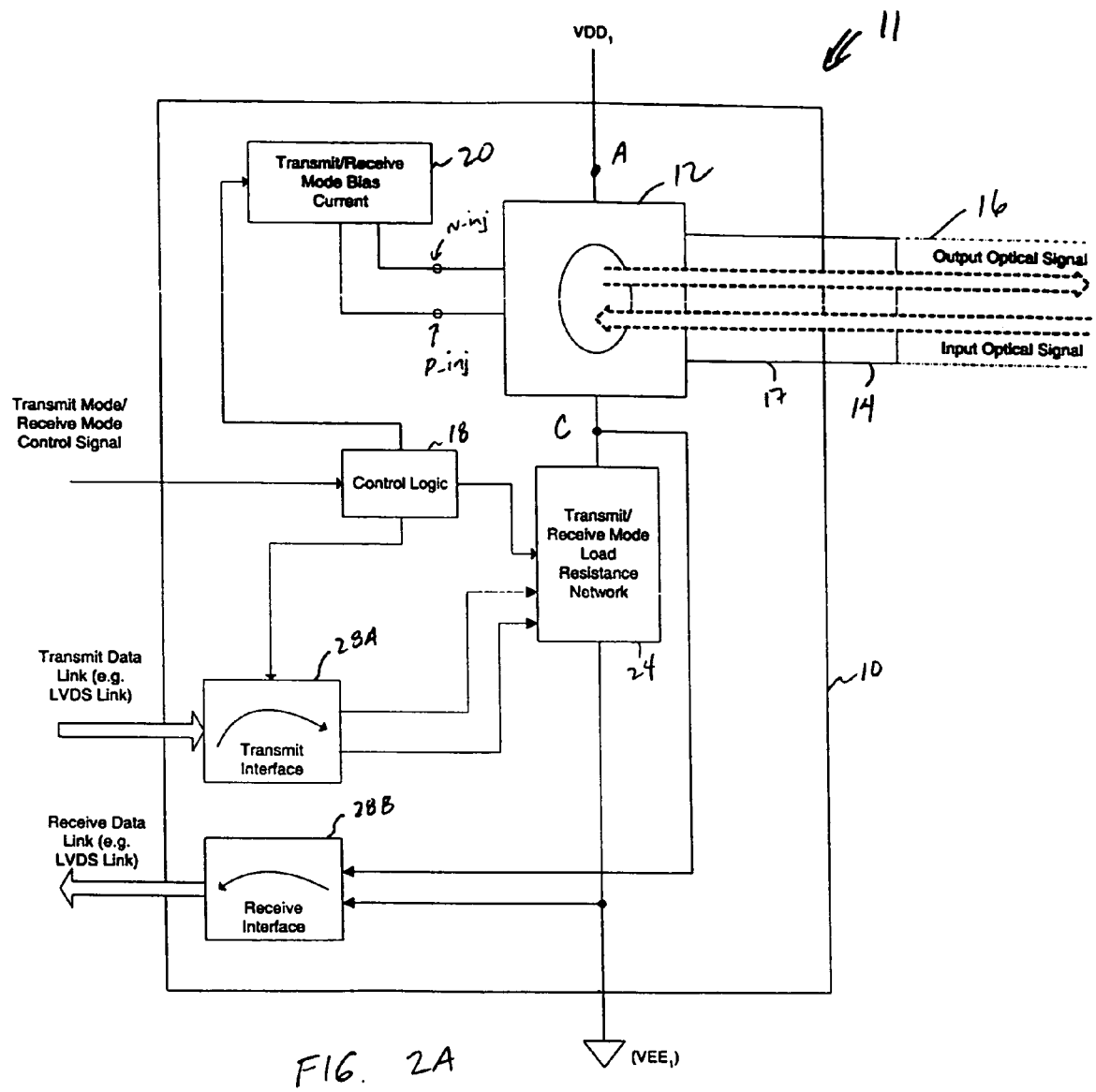
FIG. 2A is a functional block diagram illustrating the components of a first exemplary embodiment of an optoelectronic thyristor-based integrated circuit and optical transceiver module in accordance with the present invention.

FIG. 2A illustrates a functional block diagram of an optoelectronic thyristor-based integrated circuit 10 and optical transceiver module 11 in accordance with the present invention. The module 11 includes an integrated circuit 10. The integrated circuit 10 includes an optoelectronic thyristor device 12 formed within a resonant cavity, for example as described above with respect to FIG. 1. The thyristor device 12 is operably coupled by an optical interface 14 to a transmission medium 16. The transmission medium 16 may be an optical fiber in a fiber-based network. In such applications, the optical interface 14 is typically realized by a coupler that ensures proper alignment and focus of the optical signals communicated between the optical fiber and the module 11. Alternatively, the transmission medium 16 may be air or other forms of free-space in free-space communication applications. In such applications, the optical interface 14 is typically realized by one or more lens components that ensure proper alignment and focus of the optical signals communicated over the free-space medium. The thyristor device 12 can be a vertical cavity emitting/detecting device or an in-plane emitting/detecting device as described below. When the thyristor device is realized as an in-plane emitting/detecting device, a passive waveguide 17 guides the optical signals between the active region of the thyristor device and the optical interface 14. When the thyristor device is realized as a vertical cavity emitting/detecting device, the passive waveguide 17 can be omitted.

The thyristor device 12 is dynamically and switchably configured between a Transmit Mode configuration and a Receive Mode configuration by control logic 18. Preferably, the control logic 18 switches between the Transmit Mode configuration and the Receive Mode configuration in response to a control signal (e.g., transmit-mode/receive-mode control signal) supplied thereto.

In the Transmit Mode configuration, the thyristor device 12 is configured as a resonant cavity laser device that is modulated via charge injection into the quantum well interface(s) of the thyristor device 12. More specifically, control logic 18 enables the Transmit Interface circuit 28A to modulate the thyristor device 12 between a lasing state and a non-lasing state in accordance with a serial digital electrical signal received by the Transmit Interface circuit 28A. This digital electrical signal is received at the Transmit Interface circuit 28A over the Transmit Data Link as shown.

The modulation of the thyristor device 12 is accomplished by maintaining the load current $I_{LOAD}$ applied to the thyristor device 12 at a level that operates the thyristor device 12 in a non-lasing state when the serial digital electrical signal is Low, and by selectively increasing the load current $I_{LOAD}$ such that the thyristor device 12 switches into the lasing state when the serial digital electrical signal is High. The Transmit Interface Circuitry 28A controls the Load Resistance Network 24 to adjust the load resistance provided by the network 24 to provide the desired load current $I_{LOAD}$. In order to provide for fast switching of the thyristor device, the Load Resistance Network 24 provides a load current $I_{LOAD}$ in the non-lasing state at a level near but below the threshold lasing current level of the device 12: In this configuration, the Transmit/Receive Mode Bias Current Source 20, under control of the control logic 18, supplies current to the p-type QW interface and/or current to the N-type QW interface (which is discussed in detail below with reference to FIGS. 3A1, 3B1, 3C) of the thyristor device 12 such that the thyristor device 12 is constantly operating in a conducting/ON state where current is flowing through the device 12. In the Transmit Mode configuration, the modulation of the thyristor device 12 produces an output optical signal consisting of a serial pulse train of High and Low optical power levels that correspond to the serial digital electrical signal received by the Transmit Interface circuit 28A. This output optical signal is emitted from the resonant cavity encompassing the thyristor device 12 and is directed via the optical interface 14 to the transmission medium 16 for transmission over the medium.

In the Receive Mode configuration, an input optical signal consisting of a serial pulse train of High (H) and Low (L) optical power levels is transmitted over the transmission medium 16 and received at the optical interface 14. The input optical signal is injected into the resonant cavity encompassing the thyristor device 12, and the thyristor device 12 is configured as an optical-signal detector. More specifically, the control logic 18 controls Transmit/Receive Mode Bias Current Source 20, which is coupled to the n-channel injector terminal (labeled "N-Inj") and the p-channel injector terminal (labeled "P-inj") of the thyristor device 12, to provide a bias current to the n-type QW inversion interface and to the p-type QW interface of the thyristor device 12 (which is discussed in detail below with reference to FIG. 4A-4C) such that the thyristor device 12 remains in the OFF-state (with minimal current conduction through the device) when the power level of the input optical signal is Low, but switches into a conducting ON-state when the power level of the input optical signal is High. The control logic 18 controls the load resistance network 24 to adjust the load resistance provided by the network 24 such that the current flowing through the thyristor device 12 in the ON state is less than the lasing threshold current (i.e., the thyristor device 12 does not emit light in the ON state). The Transmit/Receive Mode Bias Current Source 20 (under control of the control logic 18) also supplies current to the p-type QW interface and to the N-type QW interface of the thyristor device 12 that controls the switching voltage of the device, and thus the sensitivity of the thyristor receiver. In order to provide for greater sensitivity (e.g., a decrease in the requisite intensity of the input optical signal that produces the critical switching charge $Q_{CR}$ in the n-type modulation doped heterojunction structure and in the p-type modulation doped heterojunction structure of the thyristor device), these bias currents are selected to decrease the switching voltage of the thyristor device. Thus, increased sensitivity is obtained by adjusting these bias currents to lower the switching voltage toward the hold voltage level.

In the Receive Mode configuration, the voltage level at the cathode terminal (labeled C) of the thyristor device 12 is a digital electrical signal consisting of a serial pulse train of High and Low voltage levels that corresponds to the optical pulse train of the received input optical signal. Control logic 18 controls the Receive Interface circuit 28B to output an electrical signal that represents the digital electrical signal produced by the thyristor device 12 for subsequent processing. Preferably, the Receive Interface circuit 28B produces a low voltage digital differential signal that represents the digital differential electrical signal produced at the cathode terminal of the thyristor device 12, and communicates this signal over a Receive Data Link as shown.

Figure 2B:
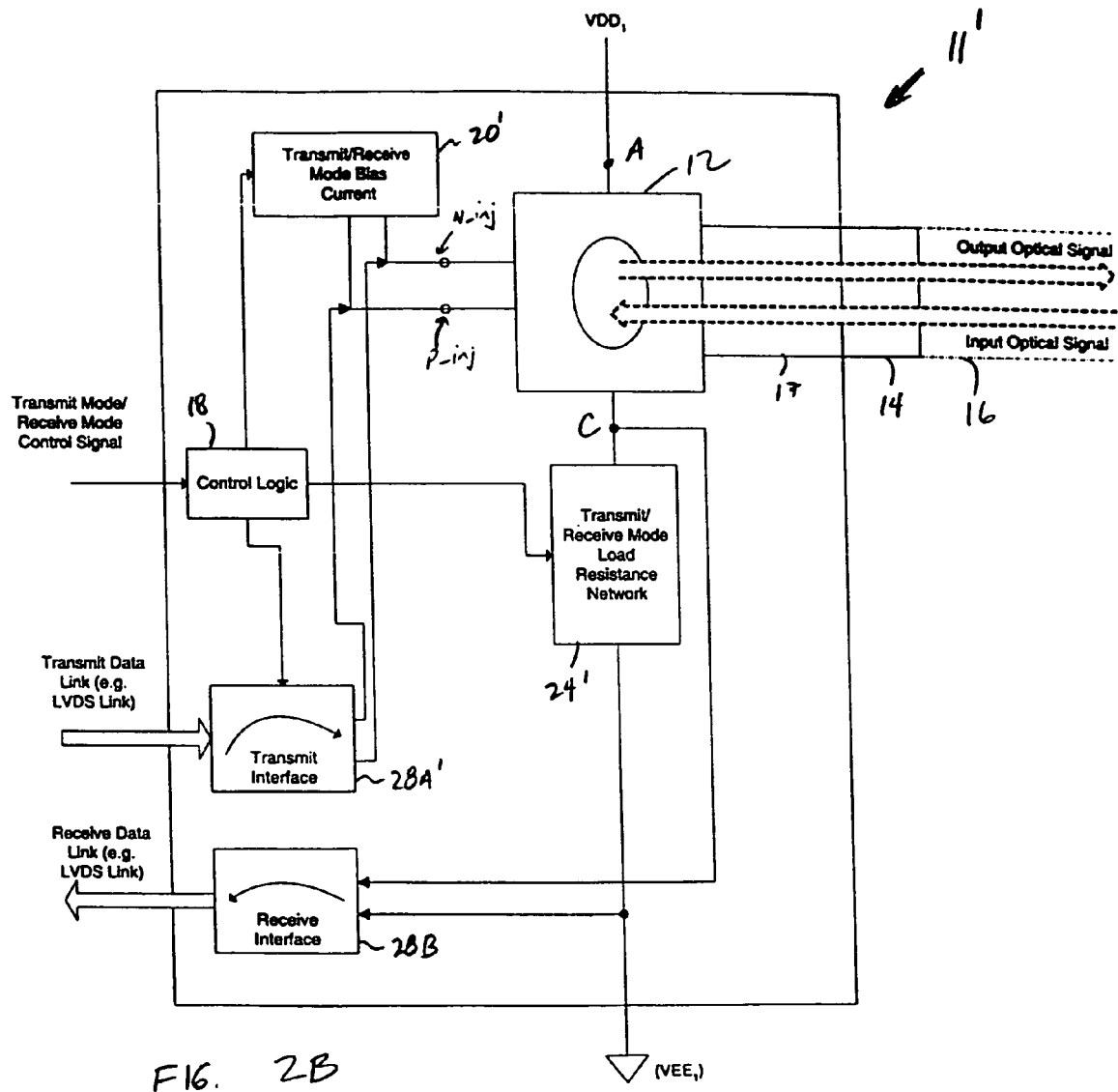
FIG. 2B is a functional block diagram illustrating the components of a second exemplary embodiment of an optoelectronic thyristor-based integrated circuit and optical transceiver module in accordance with the present invention.

In an alternate embodiment shown in FIG. 2B, the Transmit Mode configuration is adapted such that the Transmit Interface 28A' modulates the thyristor device 12 by injecting charge into the n-type QW interface and the p-type QW interface of the thyristor device 12 such that the thyristor device 12 switches into a lasing state when the serial digital electrical signal is High, and by removing charge from the n-type QW interface and in the p-type QW interface of the thyristor device 12 such that the thyristor device 12 switches from the lasing state to a non-lasing state when the serial digital electrical signal transitions from the High logic level to the Low logic level. In the Transmit Mode configuration, the control logic 18 controls the Load Resistance Network 24' to adjust the resistance provided by the network 24 such that the current flowing through the thyristor device 12 in the lasing state is greater than the lasing threshold current (i.e., the thyristor device 12 emits light in the lasing state). Preferably, the thyristor device 12 operates in a non-lasing OFF state with minimal conduction through the device. In this configuration, the Transmit/Receive Mode Bias Current Source 20' (under control of the control logic 18) supplies current to the p-type QW interface and supplies current to the N-type QW interface of the thyristor device 12 (which is discussed in detail below with reference to FIGS. 3A2, 3B2, 3C) in order to control the switching voltage of the device. In order to provide for fast switching of the thyristor device, these bias currents are selected to decrease the switching voltage of the thyristor device to a desired voltage level near the hold voltage level. In this manner, a positive-going pulse applied to the p-channel injector terminal (labeled "P-Inj") in conjunction a negative-going pulse applied to the n-channel injector terminal (labeled "N-Inj"), respectively, cooperate to switch the device between the lasing ON state and non-lasing OFF state in accordance with the voltage levels of the complementary pulses.

The Receive Mode configuration of the optoelectronic circuitry of FIG. 2B is similar to that described above with respect to the optoelectronic circuitry of FIG. 2A.

In the preferred embodiment of the present invention, the circuit components (18,20,22,24,26,28) of the integrated circuit 10 of FIG. 2A (and similarly integrated circuit 10' of FIG. 2B) are realized by transistor devices (n-channel HFET devices, p-channel HFET devices, n-type quantum-well-base bipolar transistors and/or p-type quantum-well-base bipolar transistors) that are integrally formed with an optoelectronic thyristor device on a common substrate as described above with respect to FIG. 1. In addition, the passive waveguide 17 is preferably integrally formed on the substrate. Moreover, thyristor-based differential amplifiers as described in U.S. patent application Ser. No. 10/602,217 filed on Jun. 24, 2003 may be integrally-formed on the substrate and used to realize differential drivers and differential receivers as part of an LVDS data link embodied within the I/O circuitry 28. Such monolithic integration combines optical-to-electrical conversion functionality, electrical-to-optical conversion functionality as well as the control circuitry associated therewith, which significantly reduces the costs of the integrated circuit 10 and transceiver module 11.

FIGS. 3A1-3C illustrate the Transmit Mode operational characteristics of the thyristor device 12 of FIGS. 2A and 2B. FIGS. 4A-4C illustrate the Receive Mode operational characteristics of the thyristor device of FIGS. 2A and 2B. The thyristor device 12 switches from a non-conducting/OFF state (where the current $I_{LOAD}$ is substantially zero) to a conducting/ON state (where current $I_{LOAD}$ is substantially greater than zero) when: i) the anode terminal is forward biased (e.g. biased positively) with respect to the cathode terminal; and ii) charge is introduced into the n-type modulation doped heterojunction structure 124 and/or the p-type modulation doped heterojunction structure 120 that is greater than the critical switching charge $Q_{CR}$, which is that charge that reduces the forward breakdown voltage such that no off state bias point exists. The critical switching charge $Q_{CR}$ is unique to the geometries and doping levels of the device. The switching voltage of the device (i.e., the voltage that provides the critical switching charge $Q_{CR}$) varies over the p-channel injector current $I_{g\_p}$ and the n-channel injector current $I_{g\_n}$, collectively referred to as $I_g$, as shown in FIGS. 3B1, 3B2, 4B1, and 4B2. The device switches from the conducting/ON state (where the current $I_{LOAD}$ is substantially greater than zero) to a non-conducting/OFF state (where current $I_{LOAD}$ is substantially zero) when the current $I_{LOAD}$ through the device falls below the hold current $I_H$ of the device for a sufficient period of time such that the charge in the n-type modulation doped heterojunction structure 124 and/or the p-type modulation doped heterojunction structure 120 decreases below the holding charge $Q_H$, which is the critical value of the channel charge which will sustain holding action.

Figure 3C:
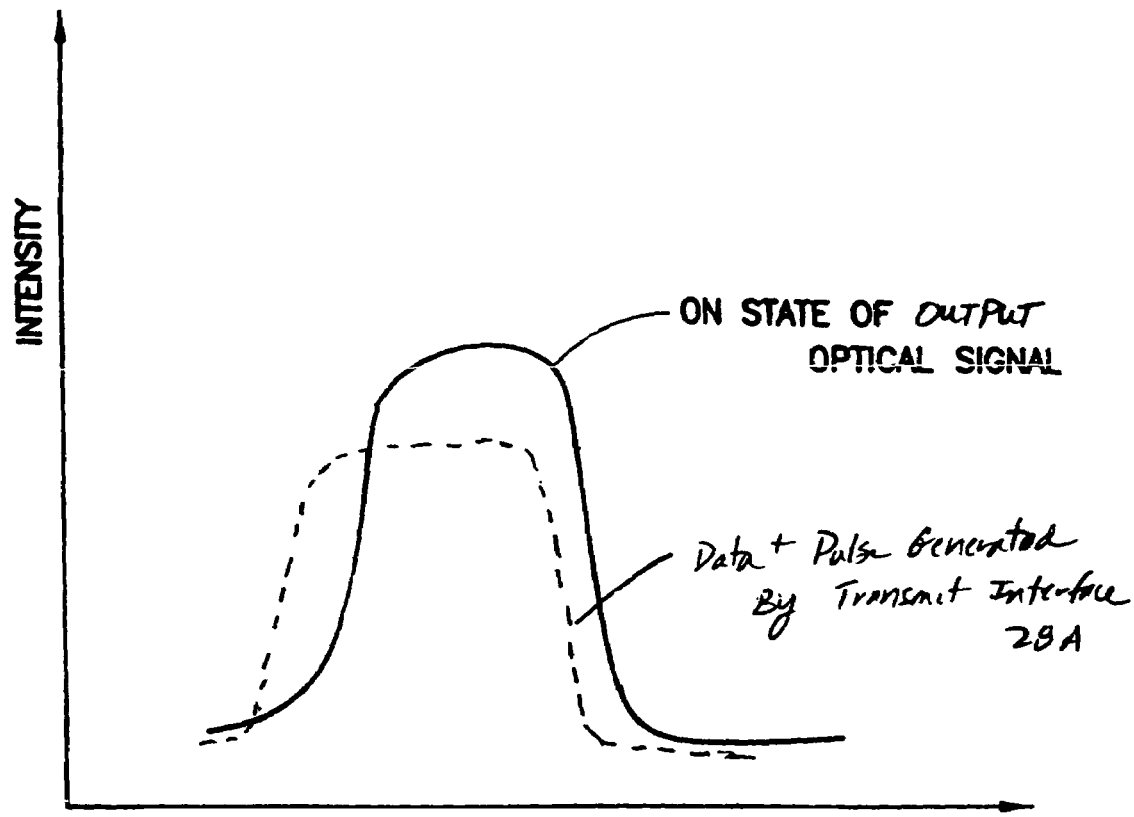
Figure 4A:
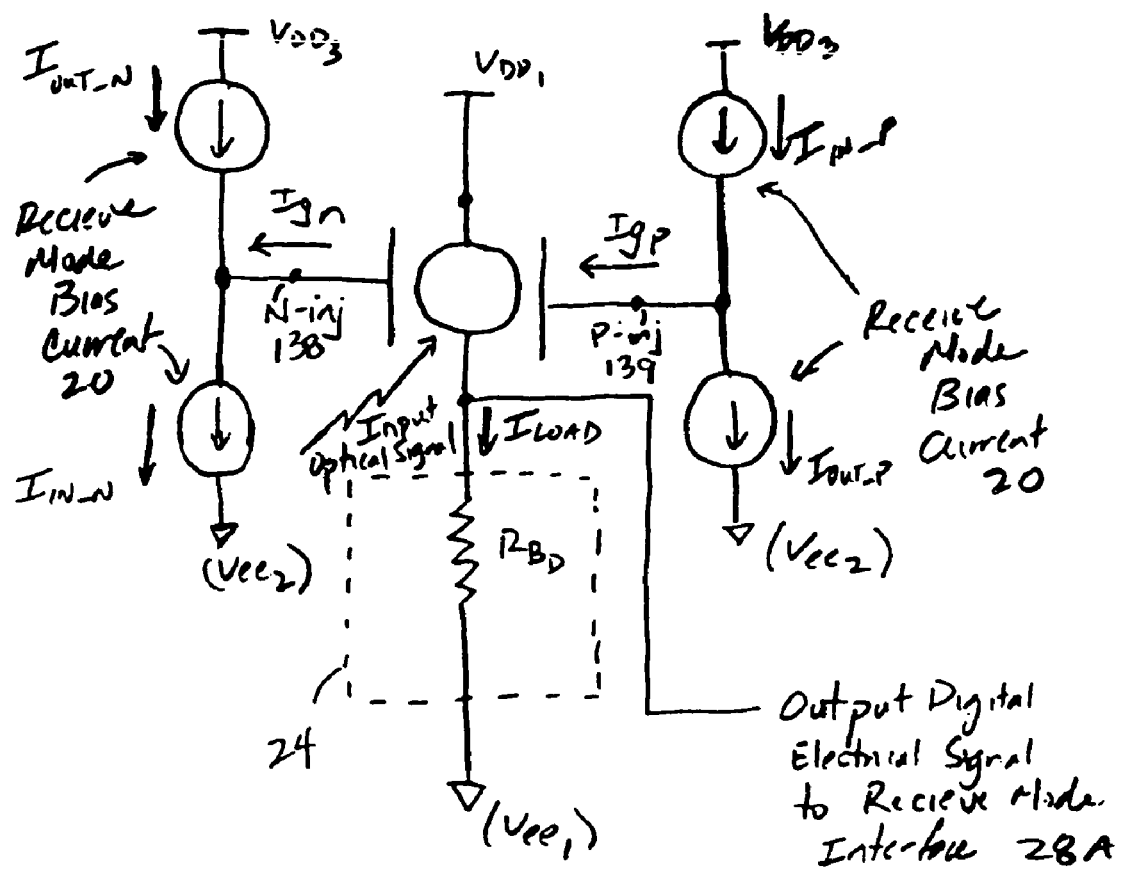
Figure 4C:
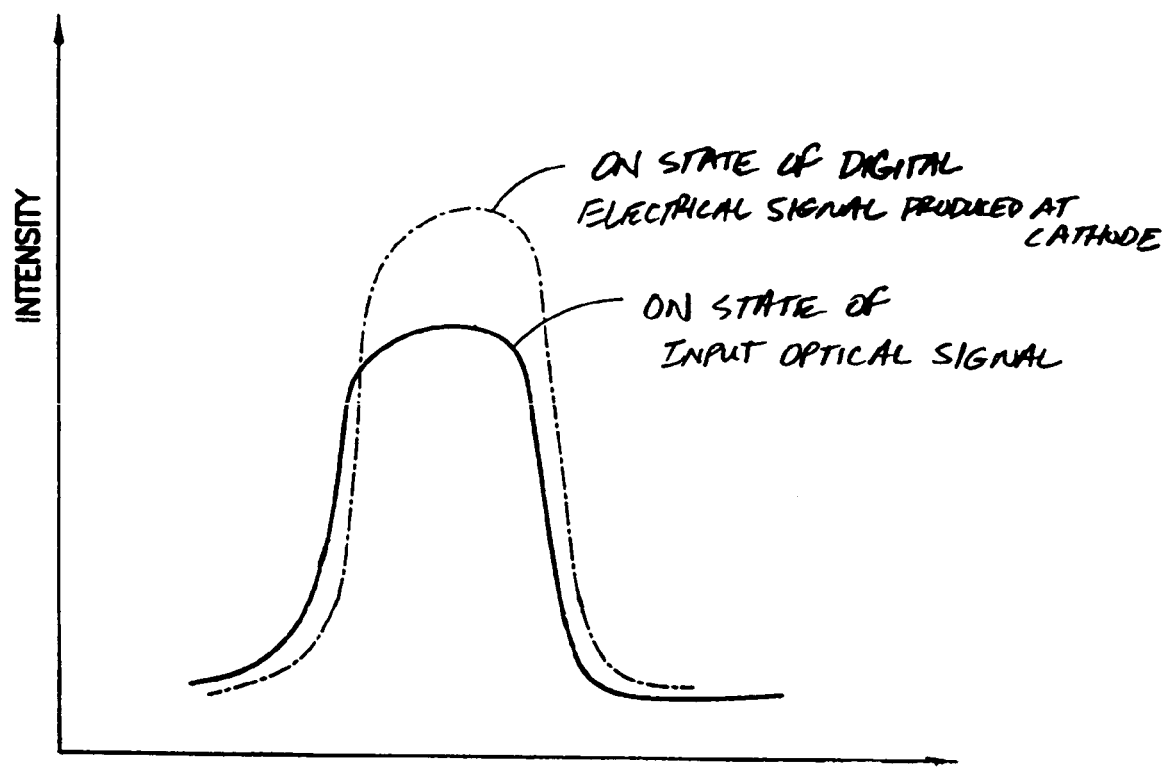

In the exemplary Transmit Mode configuration illustrated in FIG. 3A1, (which is suitable for use in the embodiment described above with respect to FIG. 2A), the anode terminal 136 is forward biased (e.g. biased positively) with respect to the cathode terminal 140. The Bias Current Source 20 includes one or more current sources that supply current $I_{IN\_N}$ to the n-channel injector terminal 138 and/or supply current $I_{IN\_P}$ to the p-channel injector terminal 139 such that the thyristor device is constantly operating in a conducting state where current is flowing through the device. The Transmit Interface circuitry 28A cooperates with the Load Resistance Network 24 to modulate the thyristor device between a lasing state and a non-lasing state in accordance with the logic levels of the serial digital electrical supplied thereto. More specifically, the Load Resistance Network 24 provides a current path through a load resistance $R_{BLon}$ as well as a current path through a load resistance $R_{BLoff}$. The current path through the load resistance $R_{BLon}$ provides a load current $I_{LON}$ through the thyristor device that is above the lasing threshold current $I_{LTH}$ (i.e., $I_{LOAD}=I_{LON}>I_{LTH}$), while the current path through the load resistance $R_{BLoff}$ provides a load current $I_{LOFF}$ through the thyristor device that is below (yet near) the lasing threshold current $I_{LTH}$ (i.e., $I_{LOAD}=I_{LOFF}<I_{LTH}$) as shown in FIG. 3B1. When the serial digital electrical signal is at a Low logic level, the current path through the load resistance $R_{BLoff}$ is activated and the current path through the load resistance $R_{BLon}$ is deactivated (e.g., open-circuited). When the serial digital electrical signal is at a High logic level, the current path through the load resistance $R_{BLon}$ is activated and the current path through the load resistance $R_{BLoff}$ is deactivated (open-circuited). Alternatively, the current path through the load resistance $R_{BLon}$ can provide a current that is added to the current through the load resistance $R_{BLoff}$ to provide a total load current above the lasing threshold current. In this configuration, when the serial digital electrical signal is at a Low logic level, the current path through the load resistance $R_{BLoff}$ is activated and the current path through the load resistance $R_{BLon}$ is deactivated (e.g., open-circuited). When the serial digital electrical signal is at a High logic level, the current paths through both load resistances $R_{BLoff}$, $R_{BLon}$ are activated. In either case, the load current applied to the thyristor device is set at a level that operates the thyristor device in a non-lasing state when the serial digital electrical signal is Low. When the serial digital electrical signal is High, the load current is increased such that the thyristor device switches into the lasing state as shown in FIG. 3C.

In the exemplary Transmit Mode configuration as illustrated in FIGS. 3A2 (which is suitable for use in the embodiment of FIG. 2B), the anode terminal 136 is forward biased (e.g. biased positively) with respect to the cathode terminal 140 and the Transmit Interface circuitry 28A' modulates the thyristor device into the ON state by supplying a negative-going pulse to the n-channel injector terminal 138 and a corresponding positive-going pulse to the p-channel injector terminal 139. Such pulses are sufficient to produce the critical switching charge $Q_{CR}$ in the n-type modulation doped heterojunction structure 124 and in the p-type modulation doped heterojunction structure 120, respectively. In addition, the load resistance network 24' is controlled by control logic 18 to provide a bias resistance $R_{BL}$ that sets the current $I_{LOAD}$ through the thyristor device in the conducting/ON state above the threshold current for lasing $I_{LTH}$ (i.e., $I_{LOAD}=I_{LON}>I_{LTH}$) and that sets the current $I_{LOAD}$ through the thyristor device in the non-conducting/OFF state below the threshold current for lasing $I_{LTH}$ (i.e., $I_{LOAD}=I_{LOFF}<I_{LTH}$) as shown in the bias line of FIG. 3B2. In this configuration, laser emission will occur in response to the negative-going pulse/positive-going pulse supplied by the Transmit Interface circuitry 28A' to the injector terminals 138, 139 of the device as shown in FIG. 3C. Note that the Bias Current Source Circuitry 20' includes current sources that are coupled to the n-channel injector terminal 138 and the p-channel injector terminal 139, respectively, in this Transmit Mode configuration. These current sources supply charge thereto (e.g., current $I_{IN\_N}$ that supplies electrons to the n-channel injector terminal 138, and current $I_{IN\_P}$ that supplies holes to the p-channel injector terminal 139) that adjusts the switching voltage level of the thyristor device preferably to a point near the hold voltage for fast switching. These current sources also adjust the requisite magnitude of the negative-going pulses/positive-going pulses that produce the critical switching charge $Q_{CR}$ in the n-type modulation doped heterojunction structure 124 and in the p-type modulation doped heterojunction structure 120, respectively.

In the Receive Mode configuration as illustrated in FIGS. 4A through 4C, the anode terminal 136 is forward biased (e.g. biased positively) with respect to the cathode terminal 140 and the Bias Current Source 20 provides a bias current $I_{OUT\_N}$ that draws charge (e.g., electrons) from the n-channel injector terminal 138 in addition to a bias current $I_{OUT\_P}$ that draws charge (e.g., holes) from the p-channel injector terminal 139. In the event that the input optical signal injected into the resonant cavity has sufficient intensity to produce photocurrent in excess of the bias currents drawing on the n-channel injector terminal 138 and such photocurrent produces the critical switching charge $Q_{CR}$ in the N-type modulation doped QW heterostructure 124 (and/or the input optical signal injected into the resonant cavity has sufficient intensity to produce photocurrent in excess of the bias current drawing on the p-channel injector terminal 139 and such photocurrent produces the critical switching charge $Q_{CR}$ in the p-type modulation doped QW heterostructure 120), the thyristor device will switch to its ON state. The Bias Current Source Circuitry 20 also includes current sources that are coupled to the n-channel injector terminal 138 and the p-channel injector terminal 139, respectively, to supply charge thereto (e.g., current $I_{IN\_N}$ that supplies electrons to the n-channel injector terminal 138, and current $I_{IN\_P}$ that supplies holes to the p-channel injector terminal 139) in the Receive Mode configuration. These current sources adjust the switching voltage level of the device, and thus adjust the sensitivity of the thyristor receiver. The load resistance network 24 is controlled by control logic 18 to provide a bias resistance $R_{BD}$ that sets the load current $I_{DON}$ in the ON state below the threshold current for lasing $I_{LTH}$ (e.g., $I_{LOAD}=I_{DON}<I_{LTH}$) and sets the load current $I_{DOFF}$ in the OFF state below the current $I_{DON}$ (e.g., $I_{LOAD}=I_{DOFF}<I_{DON}$) as shown in the bias lines of FIGS. 4B1 and 4B2. In the Receive-mode configuration of FIG. 4B1, the load resistance network 24 provides a load current in the ON state at a level well above the hold current as shown. In the Receive-mode configuration of FIG. 4B2, the load resistance network 24 provides a load current in the ON state at a level near (or below) the hold current level as shown. With the optical input signal at its Low level, the holding current $I_H$ of the device is large enough such that there is no intersection in the ON state of the thyristor device. In fact, there is only one intersection of the load line and the I-V characteristic of the thyristor in the OFF state, which occurs at a voltage $V_{DOFF}$ that is less than the critical switching voltage $V_{SW}$ as shown. Thus, with the optical input signal at its Low level, the device can only exist in the OFF state. With the optical input signal at its High level, the current-voltage characteristics of the thyristor change in two ways. First, the switching voltage is reduced so that $V_{SW}<V_{DOFF}$, and thus the load line no longer intersects the characteristic in the OFF state. Second, the holding current $I_H$ of the device is reduced so that the load line now intersects the thyristor characteristic in the ON state. In fact, the current-voltage characteristics of the thyristor device in the ON state resemble a diode. In these Receive-mode configurations, an output digital electrical signal whose logic levels represent the power levels of the input optical signal is generated at the cathode terminal of the thyristor device as shown in FIG. 4C for output to the Receive Interface circuitry 28B.

Figure 5A:
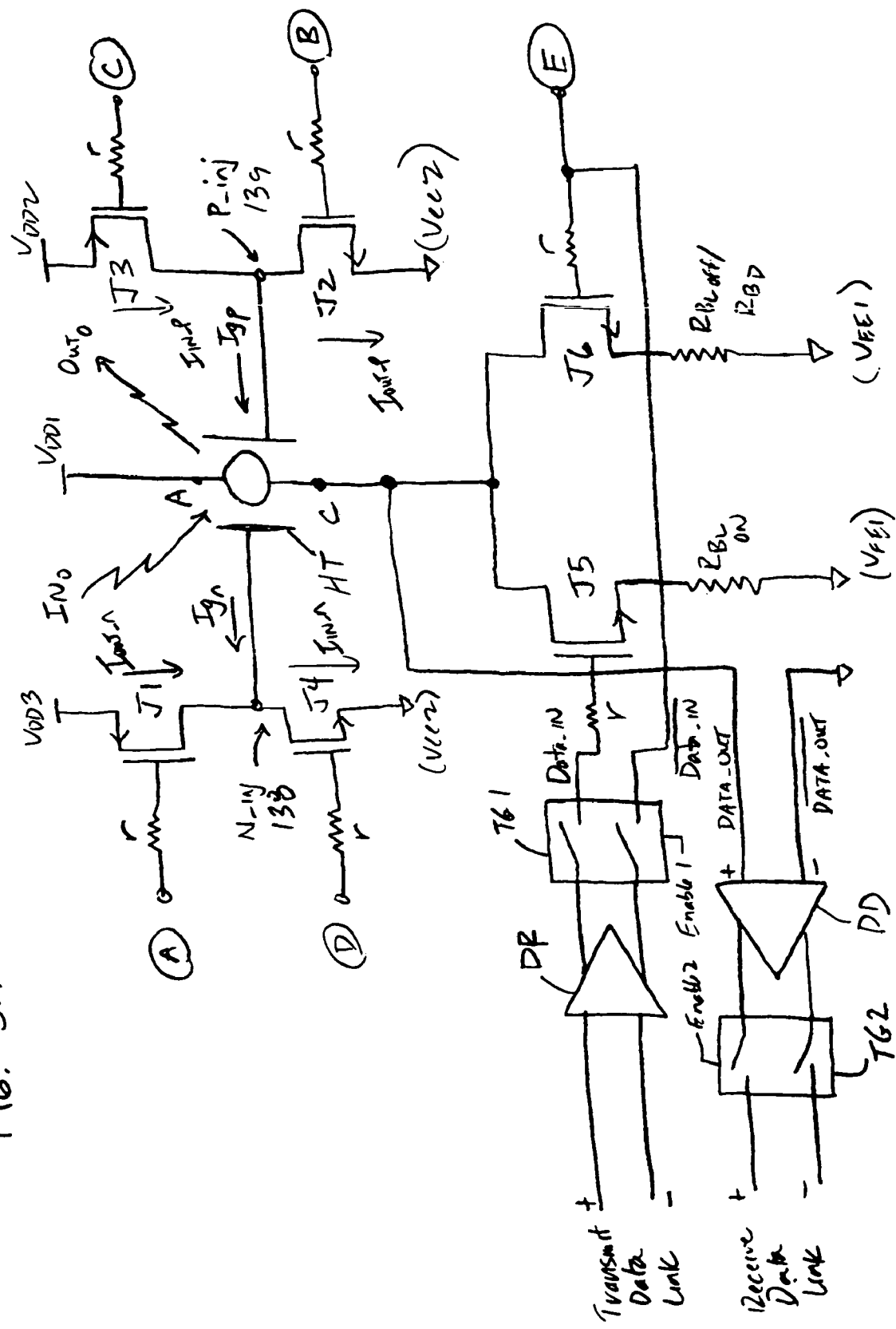

Turning now to FIG. 5A, there is shown an exemplary monolithic optoelectronic integrated circuit for use in the optical transceiver module of FIG. 2A. The optoelectronic integrated circuit includes a thyristor device HT and circuit components that are integrally formed from a common layer structure, such as the layer structure described above with respect to FIG. 1. The thyristor device HT has an anode terminal ("A"), a cathode terminal ("C"), an n-channel injector terminal 138 ("N-inj") and a p-channel injector terminal 139 ("P-inj"). The anode terminal A is coupled to the positive potential reference ($V_{DD1}$). The cathode terminal C coupled to a ground/negative reference potential ($V_{EE1}$) through a load resistance network, which includes transistors J5 and J6 coupled to bias resistors $R_{BLon}$ and $R_{Bloff}/R_{BD}$, respectively.

In one embodiment, the current path through transistor J5 and resistor $R_{BLon}$ provide a load current through the thyristor device that is above its lasing threshold current when the device is in its conducting/ON state, while the current path through the transistor J6 and resistance $R_{BLoff}/R_{BD}$ provide a load current through the thyristor device that is below its lasing threshold current when the device is in its conducting/ON state. In this embodiment, during Transmit Mode operations, the current path through the load resistance $R_{BLoff}$ is activated and the current path through the load resistance $R_{BLon}$ is deactivated (e.g., open-circuited) when the Data_IN electrical signal is at a Low logic level. Conversely, the current path through the load resistance $R_{BLon}$ is activated and the current path through the load resistance $R_{BLoff}$ is deactivated (e.g., open-circuited) when the Data_IN electrical signal is at a High logic level.

In an alternate embodiment, the current path through the load resistance $R_{BLon}$ can provide a current that is added to the current through the load resistance $R_{Bloff}/R_{BD}$ to provide a total load current above the lasing threshold current. In this configuration, during Transmit Mode operations, the current path through the load resistance $R_{BLoff}$ is activated and the current path through the load resistance $R_{BLon}$ is deactivated (e.g., open-circuited) when the Data_IN electrical signal is at a Low logic level. However, the current paths through both load resistances $R_{Bloff}$, $R_{BLon}$ are activated when the Data_IN electrical signal is at a High logic level.

In either embodiment, during Receive Mode operations, the current path through transistor J6 and resistor $R_{Bloff}/R_{BD}$ is activated while the current path through transistor J5 and resistor $R_{BLon}$ is deactivated (open-circuited). Preferably, the resistance $R_{Bloff}/R_{BD}$ is selected to provide a load current through the device that is near (yet below) the lasing threshold current for fast switching operations. Note that in certain configurations, the current path through resistor $R_{Bloff}/R_{BD}$ may be activated continuously during the Transmit Mode operations as well as during the Receive Mode operations. In such configurations, it is possible to remove the switching transistor J6 such that the resistor $R_{Bloff}/R_{BD}$ provides a constant load resistance to the cathode terminal of the thyristor device HT.

The n-channel injector terminal 138 is coupled to two current source transistors J1, J4, which are part of the Transmit/Receive Mode Current Source circuitry 20. Similarly, the p-channel injector terminal 139 is coupled to two current source transistors J2, J3, which are part of the Transmit/Receive Mode Current Source circuitry 20. The p-type HFET transistor J1, which is source-drain coupled between the n-channel injector terminal 138 and a positive reference potential ($V_{DD3}$), provides a bias current $I_{OUT\_N}$ that draws charge (e.g., electrons) from the n-type modulation doped QW interface 124 of the thyristor device HT. The n-type HFET transistor J2, which is source-drain coupled between the p-channel injector 139 and a ground/negative reference potential ($V_{EE}$), provides a bias current $I_{OUT\_P}$ that draws charge (e.g., holes) from the p-type modulation doped QW interface of the thyristor device HT. The p-type HFET transistor J3, which is source-drain coupled between a positive reference potential ($V_{DD2}$) and the p-channel injector terminal 139, provides a bias current $I_{IN\_P}$ to the p-channel injector terminal 139 that injects charge (e.g., holes) into the p-type modulation doped QW interface of the thyristor device HT. The n-type HFET transistor J4, which is source-drain coupled between the n-channel injector terminal 138 and a ground/negative reference potential ($V_{EE2}$), provides a bias current $I_{IN\_N}$ to the n-channel injector terminal 138 that injects charge (e.g., electrons) into the n-type modulation doped QW interface of the thyristor device HT. The bias currents $I_{IN\_N}$ and $I_{IN\_P}$ maintain the thyristor device HT in its conducting/On state during the Transmit Mode operations. The bias currents $I_{OUT\_N}$, $I_{OUT\_P}$ adjust the switching voltage level of the thyristor device HT. In the Receive Mode, such bias currents can be used to adjust the sensitivity of the thyristor device HT. In the Transmit Mode, such bias currents can be used to provide for fast switching.

The gate of the transistor J5 is coupled to the Data_In signal output from a differential receiver DR and transmission gate TG1, which are part of the Transmit Interface circuitry 28A of FIG. 2A. The gate of the transistor J6, if used, is coupled to the $\overline{\text{Data\_In}}$ signal output from a differential receiver DR, which is the complement of the Data_In signal. The transmission gate TG1 is opened and closed by control signals (labeled "Enable1") supplied thereto from the control logic 18. In the Transmit Mode configuration, the control logic 18 closes the transmission gate TG1. In the Receive Mode configuration, the control logic 18 opens the transmission gate TG1 to isolate the output of the differential receiver DR from the current switching transistor(s) (J5, J6). In the Transmit Mode configuration, the differential receiver DR and transmission gate TG1 cooperate to modulate the thyristor device HT1 between a non-lasing state and a lasing state by selectively activating (and deactivating) the current paths through current switching transistor(s) J5, J6 in accordance with the digital differential input signal (labeled ("+" and "−") supplied to the differential receiver DR from the Transmit Data Link.

The cathode terminal C of the thyristor device HT is part of a digital differential signal path (labeled Data_Out and $\overline{\text{Data\_Out}}$) that is supplied to a differential driver DD and transmission gate TG2, which are part of the Receive Interface circuitry 28B. The transmission gate TG2 is opened and closed by control signals (labeled "Enable2") supplied thereto from the control logic 18. In the Receive Mode configuration, the control logic 18 closes the transmission gate TG2. In the Transmit Mode configuration, the control logic 18 opens the transmission gate TG2 to isolate the Receive Data Link from the output of the differential receiver DR. In the Receive Mode configuration, the differential driver DD and transmission gate TG2 cooperate to drive the Receive Data Link with a digital differential output signal (labeled ("+" and "−") in accordance with the electrical pulse train generated at the cathode terminal of the thyristor device HT (which corresponds to the digital optical pulse stream supplied to the thyristor device HT).

Preferably, a thyristor-based differential amplifier as described in U.S. patent application Ser. No. 10/602,217 filed on Jun. 24, 2003, is used to realize the differential driver DD and the differential receiver DR as part of the Interface circuits 28A, 28B.

FIG. 5B illustrates the conducting (ON)/non-conducting (OFF) states of the transistor current sources (J1, J2, J3,J4) and the bias resistance control transistors (J5, J6) of FIG. 5A to configure the thyristor device HT for Transmit Mode operations in addition to Receive Mode operations. The currents provided by the transistor current sources (J1, J2, J3,J4) are controlled by voltage levels applied to the gates of these transistors through current limiting resistors (labeled "r") as shown in FIG. 5A. In the Transmit Mode configuration, the intensity level (ON/OFF) of the output optical signal ($\text{Out}_O$) produced by the thyristor device HT corresponds to the logic level (High/Low) of the Data_In signal (which corresponds to the digital differential signal received over the Transmit Data link). In the Receive Mode configuration, the logic level (High/Low) of the Data_Out signal produced by the thyristor device HT (and the corresponding digital differential signal transmitted over the Receive Data link) corresponds to the intensity level (ON/OFF) of the input optical signal ($\text{In}_O$) supplied to the thyristor device HT.

Figure 5C:
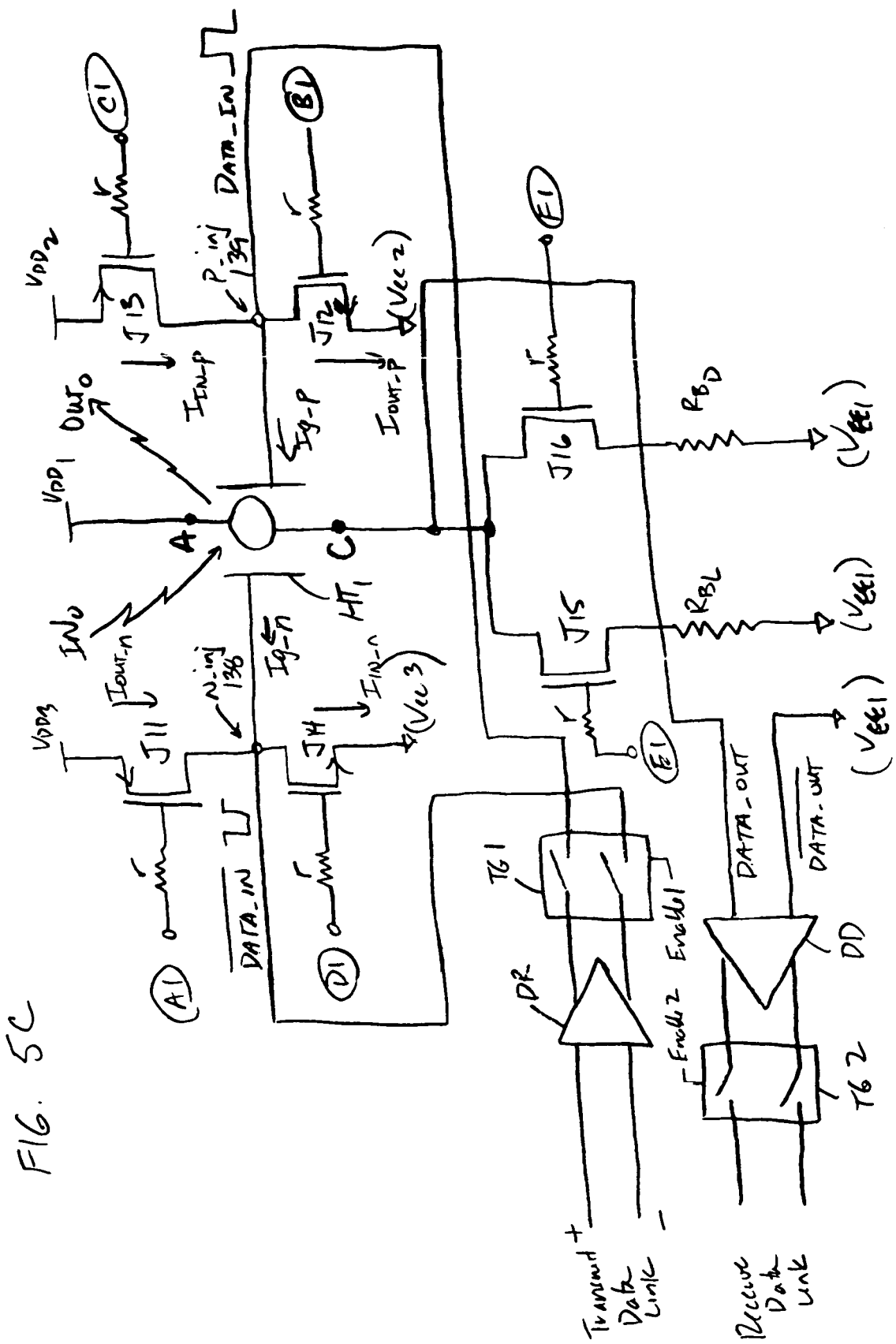

Turning now to FIG. 5C, there is shown an exemplary monolithic optoelectronic integrated circuit for use in the optical transceiver module of FIG. 2B. The optoelectronic integrated circuit includes a thyristor device HT1 and circuit components that are integrally formed from a common layer structure, such as the layer structure described above with respect to FIG. 1. The thyristor device HT1 has an anode terminal ("A"), a cathode terminal ("C"), an n-channel injector terminal 138 ("N-inj") and a p-channel injector terminal 139 ("P-inj"). The anode terminal A is coupled to the positive potential reference ($V_{DD1}$). The cathode terminal C coupled to a ground/negative reference potential ($V_{EE1}$) through a load resistance network including transistors J15 and J16 coupled to bias resistors $R_{BL}$ and $R_{BD}$, respectively. The current path through transistor J15 and resistor $R_{BL}$ provide a load current through the thyristor device that is above its lasing threshold current when the device is in its conducting/ON state, while the current path through the transistor J16 and resistance $R_{BD}$ provides a load current through the thyristor device that is below its lasing threshold current when the device is in its conducting/ON state. During Transmit Mode operations, the current path through transistor J15 and resistor $R_{BL}$ is activated and the current path through transistor J16 and resistor $R_{BD}$ is deactivated (open-circuited). Conversely, during Receive Mode operations, the current path through transistor J16 and resistor $R_{BD}$ is activated while the current path through transistor J15 and resistor $R_{BL}$ is deactivated (open-circuited).

The n-channel injector terminal 138 is coupled to two current source transistors J11, J14, which are part of the Transmit/Receive Mode Current Source circuitry 20'. Similarly, the p-channel injector terminal 139 is coupled to two current source transistors J12, J13, which are part of the Transmit/Receive Mode Current Source circuitry 20'. The p-type HFET transistor J11, which is source-drain coupled between the n-channel injector terminal 138 and a positive reference potential ($V_{DD3}$), provides a bias current $I_{OUT\_N}$ that draws charge (e.g., electrons) from the n-type modulation doped QW interface 124 of the thyristor device HT1 during its Receive Mode operations. The n-type HFET transistor J12, which is source-drain coupled between the p-channel injector 139 and a ground/negative reference potential ($V_{EE2}$), provides a bias current $I_{OUT\_P}$ that draws charge (e.g., holes) from the p-type modulation doped QW interface of the thyristor device HT1 during its Receive Mode operations. The p-type HFET transistor J13, which is source-drain coupled between a positive reference potential ($V_{DD2}$) and the p-channel injector terminal 139 that provides a bias current $I_{IN\_P}$ to the p-channel injector terminal 139 that injects charge (e.g., holes) into the p-type modulation doped QW interface of the thyristor device HT1. The n-type HFET transistor J14, which is source-drain coupled between a the n-channel injector terminal 138 and a negative/ground potential ($V_{EE3}$), provides a bias current $I_{IN\_N}$ to the n-channel injector terminal 138 that injects charge (e.g., electrons) into the n-type modulation doped QW interface of the thyristor device HT1. The bias currents $I_{IN\_N}$, $I_{IN\_P}$ adjust the switching voltage level of the thyristor device HT1. In the Receive Mode, such bias current can be used to adjust the sensitivity of the thyristor device HT1. In the Transmit Mode, such bias current can be used to provide for fast switching. It also adjusts to the requisite magnitude of the negative-going pulses/positive-going pulses that produce the critical switching charge $Q_{CR}$ in the n-type modulation doped QW interface of the thyristor device HT1 and in the p-type modulation doped QW interface of the thyristor device HT1, respectively.

The n-channel injector terminal 138 and the p-channel injector terminal 139 of the thyristor HT1 are coupled to a digital differential signal path (labeled Data_In and $\overline{\text{Data\_In}}$)

output from a differential receiver DR and transmission gate TG1, which are part of the Transmit Interface circuitry 28A'. The transmission gate TG1 is opened and closed by control signals (labeled "Enable1") supplied thereto from the control logic 18. In the Transmit Mode configuration, the control logic 18 closes the transmission gate TG1. In the Receive Mode configuration, the control logic 18 opens the transmission gate TG1 to isolate the output of the differential receiver DR from the injector terminals 138, 139 of the thyristor device HT1. In the Transmit Mode configuration, the differential receiver DR and transmission gate TG1 cooperate to modulate the thyristor device HT1 between a non-lasing state and a lasing state (by supplying a negative-going pulse to the n-channel injector terminal of the thyristor device HT1 along the $\overline{\text{Data\_In}}$ path and a corresponding positive-going pulse to the p-channel injector terminal of the thyristor device HT1 along the Data_In path) in accordance with the differential input signal (labeled ("+" and "−") supplied to the differential receiver DR from the Transmit Data Link.

The cathode terminal C of the thyristor device HT1 is part of a digital differential signal path (labeled Data_Out and $\overline{\text{Data\_Out}}$) that is supplied to a differential driver DD and transmission gate TG2, which are part of the Receive Interface circuitry 28B. The transmission gate TG2 is opened and closed by control signals (labeled "Enable2") supplied thereto from the control logic 18. In the Receive Mode configuration, the control logic 18 closes the transmission gate TG2. In the Transmit Mode configuration, the control logic 18 opens the transmission gate TG2 to isolate the Receive Data Link from the output of the differential receiver DR. In the Receive Mode configuration, the differential driver DD and transmission gate TG2 cooperate to drive the Receive Data Link with a digital differential output signal (labeled "+" and "−") in accordance with the electrical pulse train generated at the cathode terminal of the thyristor (which corresponds to the digital optical pulse stream supplied to the thyristor device).

Preferably, a thyristor-based differential amplifier as described in U.S. patent application Ser. No. 10/602,217 filed on Jun. 24, 2003, is used to realize the differential driver DD and the differential receiver DR as part of the Interface circuits 28A', 28B'.

FIG. 5D illustrates the conducting (ON)/non-conducting (OFF) states of the transistor current sources (J11, J12, J13, J14) and the bias resistance control transistors (J15, J16) of FIG. 5C to configure the thyristor device HT1 for Transmit Mode operations in addition to Receive Mode operations. The currents provided by the transistor current sources (J11, J12, J13, J14) are controlled by voltage levels applies to the gates of these transistors through current limiting resistors (labeled "r") as shown in FIG. 5C. In the Transmit Mode configuration, the intensity level (ON/OFF) of the output optical signal ($\text{Out}_O$) produced by the thyristor device HT1 corresponds to the logic level (High/Low) of the Data_In signal (which corresponds to the digital differential signal received over the Transmit Data link). In the Receive Mode configuration, the logic level (High/Low) of the Data_Out signal produced by the thyristor device HT1 (which corresponds to the digital differential signal transmitted over the Receive Data link) corresponds to the intensity level (ON/OFF) of the input optical signal ($\text{In}_O$) supplied to the thyristor device HT1.

Figure 6:
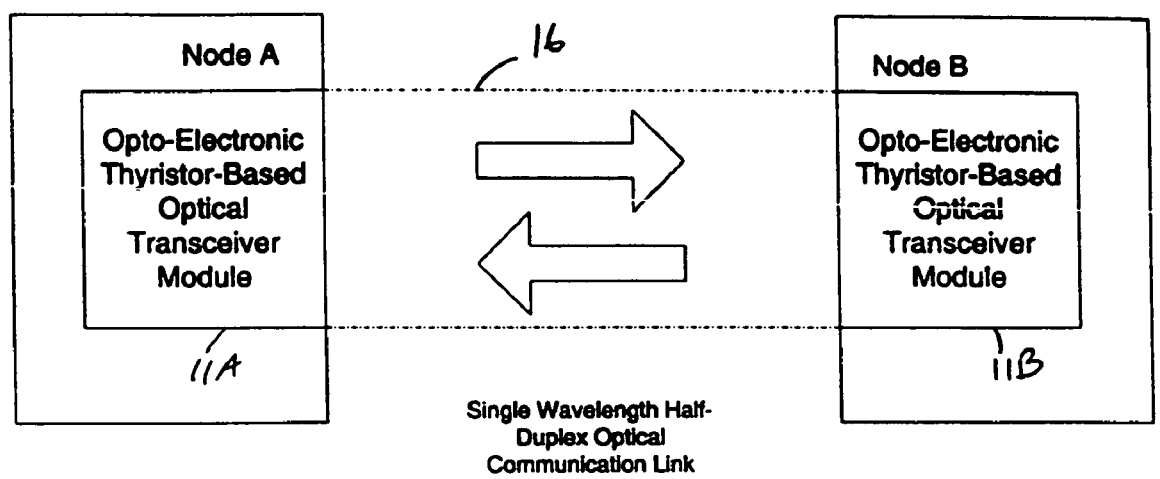
FIG. 6 illustrates a point-to-point optical communication link in accordance with the present invention, wherein thyristor-based integrated circuitry and optical transceiver modules are integrated into the two nodes of the point-to-point link to provide for single wavelength half-duplex communication between such nodes.

The thyristor-based integrated circuitry and optical transceiver modules described herein can be integrated into the nodes of an optical communication network to provide for communication between such nodes. For example, FIG. 6 illustrates a point-to-point optical communication link wherein the thyristor-based integrated circuitry and optical transceiver module described herein are integrated into the two nodes of the point-to-point link to provide for single wavelength half-duplex communication between such nodes. In this configuration, the thyristor-based optical transceiver module 11A of Node A is operated in the Transmit Mode configuration and the thyristor-based optical transceiver module 11B of Node B is operated in the Receive-Mode configuration to provide for communication from Node A to Node B. The configurations are reversed such that the thyristor-based optical transceiver module 11A of Node A is operated in the Receive Mode configuration and the thyristor-based optical transceiver module 11B of Node B is operated in the Transmit Mode configuration to provide for communication from Node B to Node A. By switching between these two configurations, half-duplex communication is accomplished between the two nodes. In fiber-based applications, this configuration is advantageous because it provides bidirectional communication with only one fiber connection and without the need for wavelength division multiplexing, and thus reduces the costs of the system. Such low cost systems have many potential applications, including low cost high speed data communication applications such as storage area networks (SANs), 10 Gigabit Ethernet interfaces, XAUI interfaces, backplane interfaces, SONET/SDH serial lines, Free Space Optics, etc. In parallel data link applications, the components of the optical transceiver module are replicated for each optical data channel and preferably monolithically integrated onto a common substrate.

Also note that the dynamic configuration of the optical transceiver module between a Transmit Mode configuration and Receive Mode configuration enables dynamic adjustment of upstream/downstream bandwidth and hence a mechanism for dynamic bandwidth management. This mechanism is very useful in applications involving connections between routers and storage units.

In the embodiments described above, control signals and bias current are applied to both the n-channel injector terminal and the p-channel injector terminal for operation of the thyristor device in the receive mode and in the transmit mode. However, such operations can be performed by applying the control signals and bias currents described herein to either one of n-channel injector terminal and the p-channel injector terminal.

Also note that the electrical output signal of the thyristor device (used in the Receive Mode configuration) can be generated at the anode terminal of the device (instead of the cathode terminal as described above). In this configuration, the bias resistance network is coupled between the positive reference voltage ($V_{DD}$) and the anode terminal of the thyristor device, and the cathode terminal is operably coupled to a ground reference potential.

In yet another embodiment, the electrical output of the thyristor device (used in the Receive Mode configuration) can be generated from both the anode terminal and the cathode terminal of the device. In such a configuration, load resistance is coupled between the positive reference potential and the anode terminal and between the cathode terminal and the negative/ground reference potential. For example, this configuration can be realized by coupling the anode terminal and the cathode terminal of the thyristor device to the Receive Interface circuitry via AC coupling capacitors to thereby provide a digital differential signal corresponding to the input optical signal. Alternatively, this configuration can be realized with AC coupling by pull-down transistor logic and/or pull-up transistor logic coupled between the anode terminal and/or cathode terminal and the Receive Interface circuitry.

Moreover, in the embodiments described above, the Load Resistance Network is realized by multiple resistive elements that provide the varying load resistance for the Transmit Mode and Receive Mode operations as described herein. Such resistive elements can be realized by linear resistors or non-linear resistive circuitry (such as active load current sources). In alternate embodiments, one or more of the multiple resistive elements may be realized by non-linear resistive circuitry that is configured to provide the varying load resistance. For example, an HFET transistor may be used to provide a varying active current source load. In this configuration, the load resistance between the source and drain of the HFET transistor is varied by adjusting the voltage level applied to the gate of the HFET transistor as is well known in the electronic arts.

Furthermore, in the embodiments described above, the Transmit Interface circuitry and Receive Interface circuitry are operably coupled to separate data links, respectively. Note that in alternative embodiments, the Transmit Interface circuitry and Receive Interface circuitry may interface to a bi-directional data link as is well known in the communication arts. In this configuration, the Transmit Interface circuitry receives serial digital data signals transmitted over the bi-directional data link, and the Receive Interface circuitry transmits serial digital data signals over the bi-directional data link.

Finally, in the embodiments described above, the optoelectronic thyristor device is monolithically integrated with the Transmit/Receive Bias Current circuitry, Load Resistance Circuitry, Transmit/Receive Interface Circuitry as well as the Control Logic. Note that in alternate embodiments, any part of these circuits may be realized as part of one or more separate integrated circuits or discrete circuit components. For example, the Load Resistance Network and/or the Bias Current circuitry may be realized by one or more separate integrated circuits and/or discrete circuit components. This system configuration provides flexibility in that the optoelectronic thyristor circuitry can be readily adapted for use in a wide variety of applications.

There have been described and illustrated herein several embodiments of an optoelectronic integrated circuits utilizing one or more complementary modulation-doped quantum well thyristor devices and optical transceiver modules based thereon. While particular embodiments of the invention have been described, it is not intended that the invention be limited thereto, as it is intended that the invention be as broad in scope as the art will allow and that the specification be read likewise. Thus, while particular group III-V heterostructures have been disclosed, it will be appreciated that other heterostructures (such as strained silicon-germanium (SiGe) heterostructures) can be used to realize the thyristor-based integrated circuits and optical transceiver module described herein. It will therefore be appreciated by those skilled in the art that yet other modifications could be made to the provided invention without deviating from its spirit and scope as claimed.

What is claimed is:

1. An apparatus comprising:
an optoelectronic thyristor device formed within a resonant cavity on a substrate, said optoelectronic thyristor device including an anode terminal, injector control terminals coupled to corresponding complementary-type first and second modulation doped quantum well interfaces, and a cathode terminal; and circuit means including first circuitry and second circuitry, said first circuitry operably coupled to said injector control terminals for injecting charge into and removing charge from each of said first and second modulation doped quantum well interfaces of said optoelectronic thyristor device, and said second circuitry operably coupled to said optoelectronic thyristor device for supplying varying bias current between said anode terminal and said cathode terminal of said optoelectronic thyristor device;
wherein said circuit means dynamically switches said optoelectronic thyristor device between a transmit mode configuration and a receive mode configuration,
wherein in the transmit mode configuration, said optoelectronic thyristor device is modulated between a non-lasing state and a lasing state in accordance with an input digital electrical signal, to thereby produce an output digital optical data signal that corresponds to the input digital electrical signal that is emitted from said resonant cavity for transmission, and
wherein in the receive mode configuration, said optoelectronic thyristor device is modulated between a non-lasing OFF state and a non-lasing ON state in accordance with an input digital optical signal that is injected into said resonant cavity, to thereby produce an output digital electrical data signal that corresponds to the input digital optical signal.

2. An apparatus according to claim 1, wherein:
said first circuitry of said circuit means includes a plurality of current sources that modulate said optoelectronic thyristor device between said lasing state and said non-lasing state in the transmit mode configuration.

3. An apparatus according to claim 1, wherein:
said second circuitry of said circuit means provides a bias current between the anode terminal and cathode terminal less than a threshold lasing current in the receive mode configuration.

4. An apparatus according to claim 1, wherein:
said second circuitry of said circuit means includes transmit bias load circuitry operably coupled to said cathode terminal in the transmit mode configuration and receive bias load circuitry operably coupled to said cathode terminal in the receive mode configuration.

5. An apparatus according to claim 1, wherein:
said circuit means comprises control circuitry, operably coupled to said first and second circuitry, said control circuitry operating in the transmit mode configuration to control said first and second circuitry to modulate said optoelectronic thyristor device between a non-lasing state and a lasing state in accordance with the input digital electrical signal to thereby produce the output digital optical data signal, and said control circuitry operating in the receive mode configuration to control said first and second circuitry to modulate said optoelectronic thyristor device between a non-lasing OFF state and a non-lasing ON state in accordance with the input digital optical electrical signal injected into said resonant cavity to thereby produce the output digital electrical data signal.

6. An apparatus according to claim 5, wherein:
said optoelectronic thyristor and said circuit means, are realized by devices integrally formed on a common substrate.

7. An apparatus according to claim 6, wherein:
said devices are formed from a common epitaxial structure deposited on the common substrate.

8. An apparatus according to claim 7, wherein:
said common epitaxial structure comprises a III-V material system.

9. An apparatus according to claim 1, further comprising:
input/output circuitry that (i) receives an input data signal over a first data link coupled thereto, generates the input digital electrical signal in accordance with the received input data signal, and supplies the input digital electrical signal to said circuit means, and (ii) receives the output digital electrical signal, generates an output data signal in accordance with the received output digital electrical signal, and transmits the output data signal over a second data link coupled thereto.

10. An apparatus according to claim 9, wherein:
said first and second data links comprise separate transmit and receive data links.

11. An apparatus according to claim 9, wherein:
said first and second data links comprise a bi-directional data link.

12. An apparatus according to claim 9, wherein:
said optoelectronic thyristor, said circuit means, and said input/output circuitry is integrated onto a common substrate.

13. The apparatus according to claim 1, wherein:
said resonant cavity is adapted for vertical emission and injection of light.

14. The apparatus according to claim 1, wherein:
said resonant cavity is adapted for in-plane emission and injection of light.

15. The apparatus according to claim 14, further comprising:
a passive waveguide device that guides light to and from said resonant cavity.

16. The apparatus according to claim 15, wherein:
said passive waveguide is integrally formed with said optoelectronic thyristor device on a common substrate.

17. The apparatus according to claim 1, further comprising:
an optical interface operably coupled between said optoelectronic thyristor device and a transmission medium.

18. The apparatus according to claim 17, wherein:
said transmission medium comprises an optical fiber.

19. The apparatus according to claim 17, wherein:
said transmission medium comprises free-space.

20. The apparatus according to claim 1, wherein:
said optoelectronic thyristor device is controllably switched between the transmit-mode configuration and the receive-mode configuration to provide for variable bandwidth over an optical communication link terminated by said apparatus.

21. An integrated circuit comprising:
an optoelectronic thyristor device formed within a resonant cavity on a substrate, said optoelectronic thyristor device including an anode terminal, injector control terminals coupled to corresponding complementary-type first and second modulation doped quantum well interfaces, and a cathode terminal; and
circuit means, integrally formed on said substrate, including first circuitry and second circuitry, said first circuitry operably coupled to said injector control terminals for injecting charge into and removing charge from each of said first and second modulation doped quantum well interfaces of said optoelectronic thyristor device, and said second circuitry operable coupled to said optoelectronic thyristor device for supplying varying bias current between said anode terminal and said cathode terminal of said optoelectronic thyristor device;
wherein said circuit means dynamically switches said optoelectronic thyristor device between a transmit mode configuration and a receive mode configuration,
wherein in the transmit mode configuration, said optoelectronic thyristor device is modulated between a non-lasing state and a lasing state in accordance with an input digital electrical signal, to thereby produce an output digital optical data signal that corresponds to the input digital electrical signal that is emitted from said resonant cavity for transmission therefrom, and
wherein in the receive mode configuration, said optoelectronic thyristor device is modulated between a non-lasing OFF state and a non-lasing ON state in accordance with an input digital optical signal that is injected into said resonant cavity, to thereby produce an output digital electrical data signal that corresponds to the input digital optical signal.

22. An integrated circuit according to claim 21, wherein:
said first circuitry of said circuit means includes a plurality of current sources that modulate said optoelectronic thyristor device between said lasing state and said non-lasing state in the transmit mode configuration.

23. An integrated circuit according to claim 21, wherein:
said second circuitry of said circuit means provides a bias current between the anode terminal and cathode terminal less than a threshold lasing current in the receive mode configuration.

24. An integrated circuit according to claim 21, wherein:
said second circuitry of said circuit means comprises transmit bias load circuitry operably coupled to said cathode terminal in the transmit mode configuration and receive bias load circuitry operably coupled to said cathode terminal in the receive mode configuration.

25. An integrated circuit according to claim 21, wherein:
said circuit means comprises control circuitry, operably coupled to said first and second circuitry, said control circuitry operating in the transmit mode configuration to control said first and second circuitry to modulate said optoelectronic thyristor device between a non-lasing state and a lasing state in accordance with the input digital electrical signal to thereby produce the output digital optical data signal, and said control circuitry operating in the receive mode configuration to control said first and second circuitry to modulate said optoelectronic thyristor device between a non-lasing OFF state and a non-lasing ON state in accordance with the input digital optical electrical signal injected into said resonant cavity to thereby produce the output digital electrical data signal.

26. An integrated circuit according to claim 25, wherein:
said resonant cavity is adapted for vertical emission and injection of light.

27. An integrated circuit according to claim 25, wherein:
said resonant cavity is adapted for in-plane emission and injection of light.

28. An integrated circuit according to claim 27, further comprising:
a passive waveguide device that guides light to and from said resonant cavity, said passive waveguide integrally formed with said optoelectronic thyristor device on said substrate.

29. An optical transceiver module comprising:

an integrated circuit including an optoelectronic thyristor device formed within a resonant cavity on a substrate and circuit means integrally formed on said substrate, said optoelectronic thyristor device including an anode terminal, injector control terminals coupled to corresponding complementary-type first and second modulation doped quantum well interfaces, and a cathode terminal, said circuit means including first circuitry and second circuitry, said first circuitry operably coupled to said injector control terminals for injecting charge into and removing charge from each of said first and second modulation doped quantum well interfaces of said optoelectronic thyristor device, and said second circuitry operable coupled to said optoelectronic thyristor device for supplying varying bias current between said anode terminal and said cathode terminal of said optoelectronic thyristor device;

wherein said circuit means dynamically switches said optoelectronic thyristor device between a transmit mode configuration and a receive mode configuration, wherein in the transmit mode configuration, said optoelectronic thyristor device is modulated between a non-lasing state and a lasing state in accordance with an input digital electrical signal, to thereby produce an output digital optical data signal that corresponds to the input digital electrical signal that is emitted from said resonant cavity for transmission by the optical transceiver module, and wherein in the receive mode configuration, said optoelectronic thyristor device is modulated between an non-lasing OFF state and a non-lasing ON state in accordance with an input digital optical signal that is injected into said resonant cavity, to thereby produce an output digital electrical data signal that corresponds to the input digital optical signal; and an optical interface operably coupled between said optoelectronic thyristor device and an optical transmission medium.

30. An optical transceiver module according to claim 29, wherein:

said first circuitry of said circuit means includes a plurality of current sources that modulate said optoelectronic thyristor device between said lasing state and said non-lasing state in the transmit mode configuration.

31. An optical transceiver module according to claim 29, wherein:

said second circuitry of said circuit means provides a bias current between the anode terminal and cathode terminal less than a threshold lasing current in the receive mode configuration.

32. An optical transceiver module according to claim 29, wherein:

said second circuitry of said circuit means comprises transmit bias load circuitry operably coupled to said cathode terminal in the transmit mode configuration and receive bias load circuitry operably coupled to said cathode terminal in the receive mode configuration.

33. An optical transceiver module according to claim 29, wherein:

said circuit means comprises control circuitry, operably coupled to said first and second circuitry, said control circuitry operating in the transmit mode configuration to control said first and second circuitry to modulate said optoelectronic thyristor device between a non-lasing state and a lasing state in accordance with the input digital electrical signal to thereby produce the output digital optical data signal, and said control circuitry operating in the receive mode configuration to control said first and second circuitry to modulate said optoelectronic thyristor device between a non-lasing OFF state and a non-lasing ON state in accordance with the input digital optical electrical signal injected into said resonant cavity to thereby produce the output digital electrical data signal.

34. An optical transceiver module according to claim 29, wherein:

said resonant cavity is adapted for vertical emission and injection of light.

35. An optical transceiver module according to claim 29, wherein:

said resonant cavity is adapted for in-plane emission and injection of light.

36. An optical transceiver module according to claim 35, wherein:

said integrated circuit includes a passive waveguide device that guides light to and from said resonant cavity, said passive waveguide integrally formed with said optoelectronic thyristor device on said substrate.

37. An optical transceiver module according to claim 29, wherein:

said transmission medium comprises an optical fiber.

38. An optical transceiver module according to claim 29, wherein:

said transmission medium comprises free-space.

* * * * *